(12) United States Patent
Ohsawa

(10) Patent No.: US 7,558,139 B2
(45) Date of Patent: Jul. 7, 2009

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/844,098

(22) Filed: Aug. 23, 2007

(65) Prior Publication Data

US 2008/0049529 A1    Feb. 28, 2008

(30) Foreign Application Priority Data

Aug. 28, 2006   (JP)  .............................. 2006-231181

(51) Int. Cl.
*G11C 7/00*    (2006.01)
(52) U.S. Cl. ..................... 365/205; 365/221; 365/236
(58) Field of Classification Search ................ 365/205, 365/225.7, 233, 236, 221
See application file for complete search history.

(56) References Cited

U.S. PATENT DOCUMENTS

| | | | | |
|---|---|---|---|---|
| 5,249,165 A | * | 9/1993 | Toda ..................... 365/189.15 |
| 5,825,704 A | * | 10/1998 | Shau ......................... 365/222 |
| 5,986,918 A | * | 11/1999 | Lee ............................. 365/103 |
| 6,011,751 A | * | 1/2000 | Hirabayashi ................ 365/236 |
| 6,091,640 A | * | 7/2000 | Kawahara et al. ...... 365/185.28 |
| 6,847,555 B2 | * | 1/2005 | Toda ..................... 365/185.21 |
| 6,980,474 B2 | | 12/2005 | Ohsawa |

* cited by examiner

*Primary Examiner*—Gene N. Auduong
(74) *Attorney, Agent, or Firm*—Oblon, Spivak, McClelland, Maier & Neustadt, P.C.

(57) ABSTRACT

This disclosure concerns a semiconductor memory device comprising memory cells; word lines connected to the gates of the memory cells; bit lines connected to the drains of the plurality of memory cells; sense amplifiers detecting data stored in the memory cells via the bit lines, the sense amplifiers writing data to the memory cells via the bit lines and latching read data or data to be written; and a plurality of transfer gates connecting or disconnecting the sense amplifiers to or from the bit lines, in a period of a serial access for continuously writing the data to the memory cells connected to an activated word line among the word lines, the transfer gates connecting the sense amplifiers to the bit lines corresponding to the sense amplifiers, respectively, after the sense amplifiers corresponding to the memory cells latch the data.

13 Claims, 20 Drawing Sheets

HALF ADDER HA

SIXTH EMBODIMENT

SEVENTH EMBODIMENT

EIGHTH EMBODIMENT

SEMICONDUCTOR MEMORY DEVICE

CROSS-REFERENCE TO RELATED APPLICATION

This application is based upon and claims the benefit of priority from the prior Japanese Patent Application No. 2006-231181, filed on Aug. 28, 2006, the entire contents of which are incorporated herein by reference.

BACKGROUND OF THE INVENTION

1. Field of the Invention

The present invention relates to a semiconductor memory device, and, for example relates to a semiconductor memory device to which data is written by carrying a current between a source and a drain.

2. Related Art

In recent years, an FBC (Floating Body Cell) memory, an MRAM (Magnetic Random Access Memory), a PRAM (Phase Change Random Access Memory) and the like are known as memory devices expected to replace a DRAM (Dynamic Random Access Memory). As for the DRAM, no current is applied to memory cells when data is written to the memory cells. As for the FBC memory, the MRAM, and the PRAM, a current is applied to memory cells when data is written to the memory cells. For example, the FBC memory device includes FBCs each of which is constituted by an FET (Field Effect Transistor) that includes a floating body (hereinafter, also "body") provided on an SOI (Silicon On Insulator). A current is applied to the body, whereby the FBC controls the number of majority carriers accumulated in each body and stores therein data "1" or data "0" according to the number of majority carriers.

In this way, the FBC consumes current when data is written to the FBC. In serial access such as burst mode access is made to a conventional FBC memory, sense amplifiers continue to apply write bias to FBCs based on latch data during the serial access. Due to this, the conventional FBC memory has a disadvantage of high current consumption.

To solve the disadvantage, there is known a method of connecting sense amplifiers only to bit lines in a selected column during a data writing operation, and applying a current only to selected memory cells connected to the bit lines. If this method is used, it is necessary to provide an additional circuit in each of the sense amplifiers for connecting only the selected bit lines to the respective sense amplifiers, with the result that each sense amplifier is made large in circuit scale.

SUMMARY OF THE INVENTION

A semiconductor memory device according to an embodiment of the present invention comprises a plurality of memory cells including gates, sources, and drains, data being written to the memory cells by current carried between the sources and the drains; a plurality of word lines connected to the gates of the memory cells; a plurality of bit lines connected to the drains of the plurality of cells; a plurality of sense amplifiers detecting data stored in the memory cells via the bit lines, the sense amplifiers writing data to the memory cells via the bit lines and latching read data or data to be written; and a plurality of transfer gates connecting or disconnecting the sense amplifiers to or from the bit lines, in a period of a serial access for continuously writing the data to the memory cells connected to an activated word line among the word lines, the transfer gates connecting the sense amplifiers to the bit lines corresponding to the sense amplifiers, respectively, after the sense amplifiers corresponding to the memory cells latch the data.

DETAILED DESCRIPTION OF THE INVENTION

Embodiments of the present invention will be explained below with reference to the accompanying drawings. The present invention is not limited to the embodiments.

First Embodiment

Figure 1:
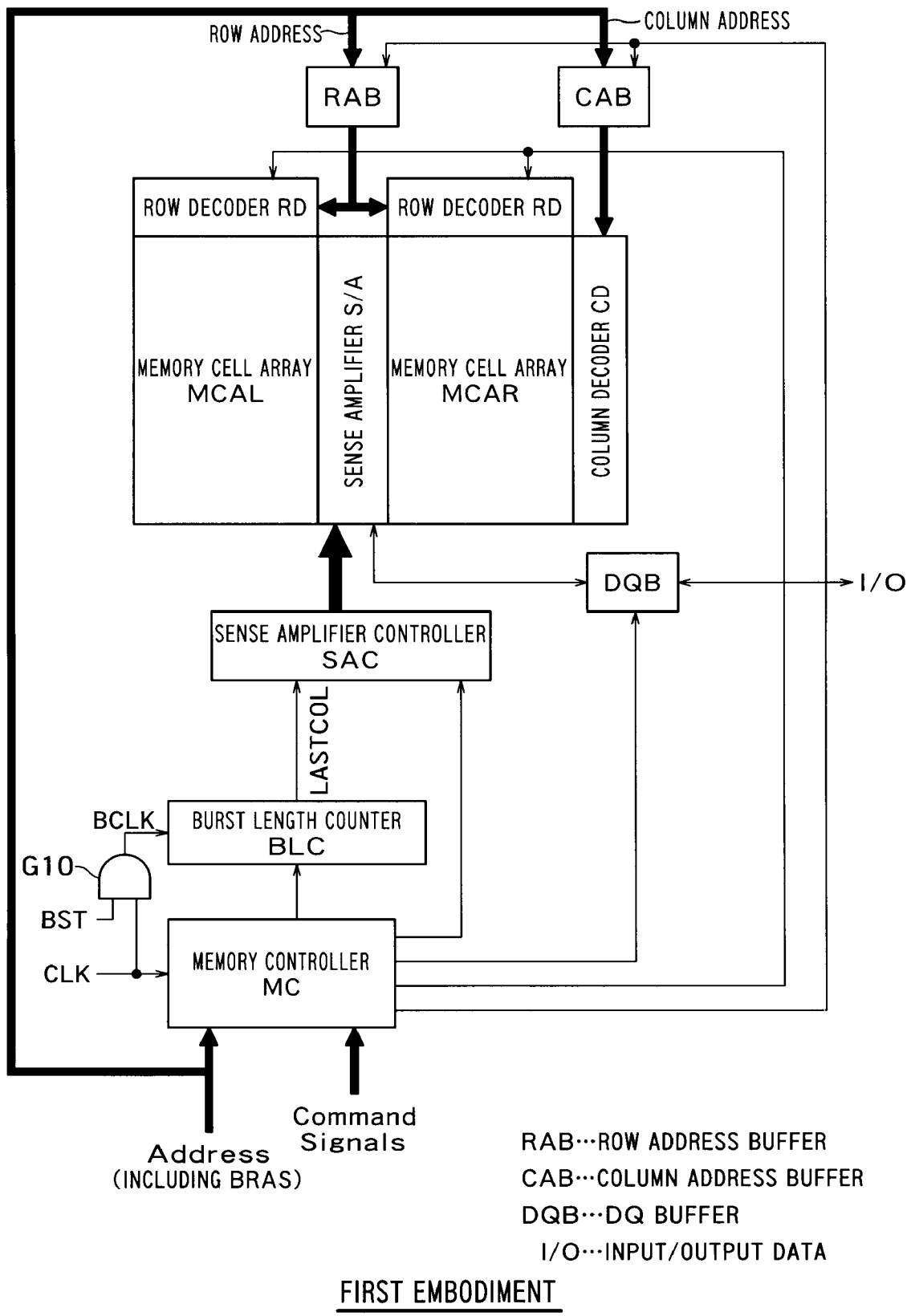
FIG. 1 is a block diagram showing a configuration of an FBC memory device according to a first embodiment of the present invention.

FIG. 1 is a block diagram showing a configuration of an FBC memory device according to a first embodiment of the present invention. The FBC memory device shown in FIG. 1 includes sense amplifiers S/As, and memory cell arrays MCAL and MCAR (hereinafter, also "MCAs") arranged on both sides of the sense amplifiers S/As, respectively. A row decoder RD selects a word line in each of the memory cell arrays MCAs, and a column decoder CD selects a bit line in each of the memory cell arrays MCAs. A row address buffer RAB receives a row address from an outside of the FBC memory device, temporarily stores therein the received row address, and outputs the row address to the row decoder RD.

A column address buffer CAB receives a column address from the outside of the FBC memory device, temporarily stores therein the received column address, and outputs the column address to the column decoder CD. A DQ buffer DQB is connected between the sense amplifiers S/A and an input/output unit. The DQ buffer DQB temporarily stores therein data read from each sense amplifier SA so as to output the read data to the outside as input/output data I/O or temporarily stores therein write data from the outside so as to transmit the write data to each sense amplifier SA. A sense amplifier controller controls the sense amplifiers. A memory controller MC controls respective constituent elements of the FBC memory device in response to command signals from the outside.

The FBC memory device according to the first embodiment also includes a burst length counter BLC between the sense amplifier controller SAC and the memory controller MC. The burst length counter BLC is configured to count the number of accesses to columns in a burst mode. The "burst mode" means a mode in which a certain column address is designated, thereby accessing a plurality of column addresses continuous to the designated column address and serially reading or writing data. A continuous access to a plurality of memory cells (i.e., a plurality of columns) connected to an activated word line in the burst mode is called "serial access". A "burst length" means the number of data continuously written to the corresponding sense amplifier S/A or the number of data continuously read from the corresponding sense amplifier S/A in a certain burst mode.

The burst length counter BLC activates a last column signal LASTCOL serving as a first signal when the number of accesses is equal to a preset burst length. In other words, the burst length counter BLC activates the last column signal LASTCOL when the number of times of continuously writing data to the sense amplifiers S/As corresponding to the respective continuous columns or the number of times of continuously reading data from the corresponding sense amplifiers S/As is equal to the burst length.

When the last column signal LASTCOL is inactive, data is latched by the sense amplifier S/A corresponding to the selected column. At this time, the bit line in the selected column is still disconnected from the corresponding sense amplifier S/A. The bit line is disconnected from the sense amplifier S/A until the number of accesses is equal to the burst length, and the sense amplifier S/A continues to be in a data latching state.

When the last column signal LASTCOL is active, the burst length counter BLC controls the sense amplifier controller SAC to connect bit lines including a plurality of bit lines corresponding to the columns selected by the serial access to the corresponding sense amplifiers S/As, respectively. The serial access thereby enables data including the latched data to be written to or written back to a plurality of memory cells corresponding to the columns.

A burst start signal BST and a clock signal CLK are input to an AND gate G10, and a logical AND between the signals BST and CLK is output from the AND gate G10 as a burst clock BCLK. When a burst mode starts, the burst start signal BST rises and the AND gate G10 causes the clock signal CLK to pass through the burst length counter BLC as the burst clock BCLK. The burst length counter BLC can recognize the number of serial accesses by counting the number of burst clocks BCLK in a certain burst mode. A configuration of the burst length counter BLC will be described later in detail with reference to FIG. 5.

"To activate" means to turn on or drive an element or a circuit and "to deactivate" means to turn off or stop the element or the circuit. It is to be noted, therefore, a HIGH (high potential level) signal is an activation signal in one case and a LOW (low potential level) signal is an activation signal in another case. For example, an NMOS transistor is activated by setting the gate HIGH. Meanwhile, a PMOS transistor is activated by setting the gate LOW.

Figure 2:
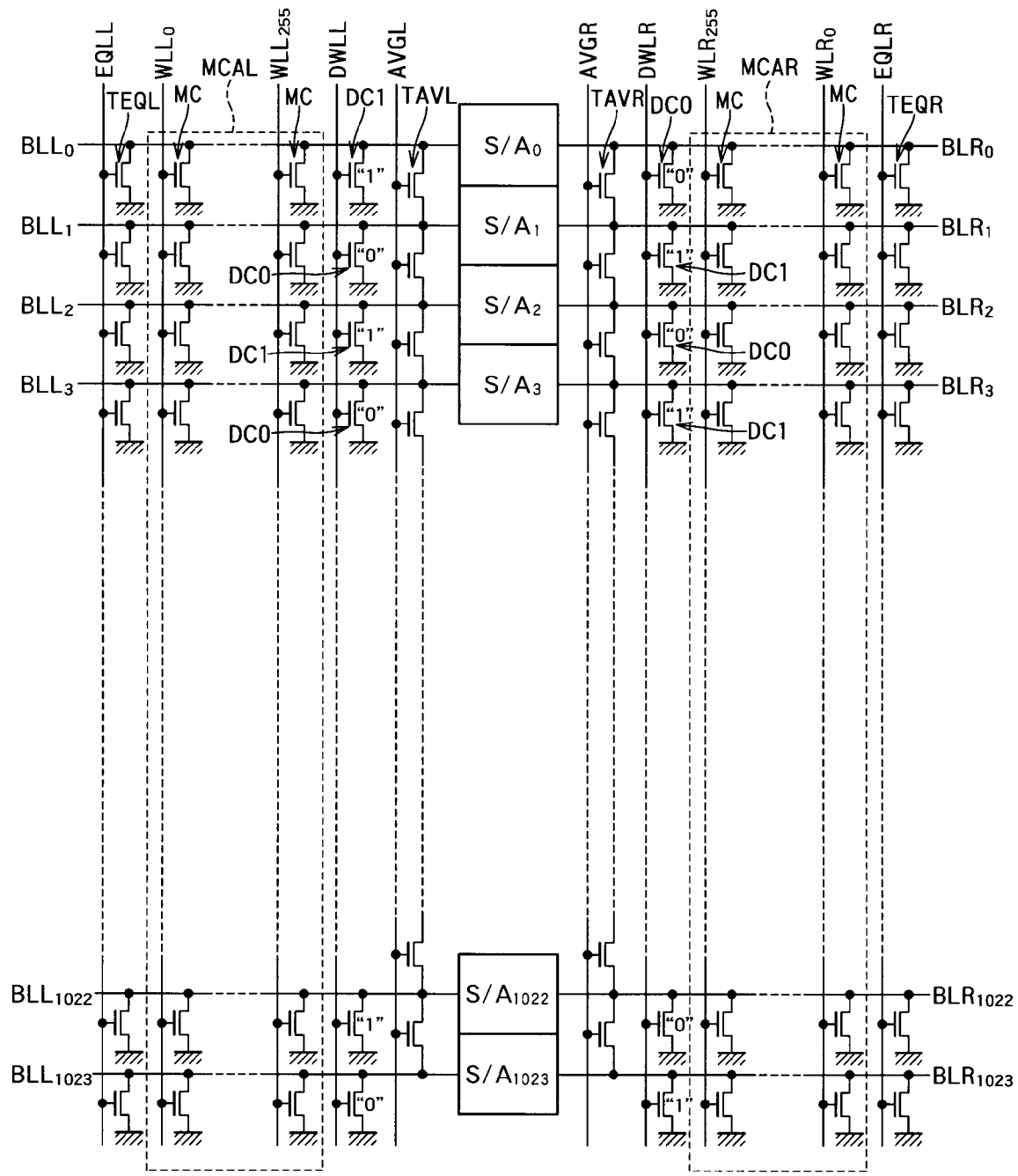
FIG. 2 is a circuit diagram showing internal configurations of the memory cell arrays MCAL and MCAR.

FIG. 2 is a circuit diagram showing an internal configuration of each of the memory cell arrays MCAL and MCAR. The FBC memory device includes memory cells MCs, first dummy cells DC0 and second dummy cells DC1 (hereinafter, also "DCs"), word lines WLLi and WLRi (where i is an integer) (hereinafter, also "WLs"), dummy word lines DWLL and DWLR (hereinafter, also "DWLs"), bit lines BLLi and BLRi (hereinafter, also "BLs"), sense amplifiers S/Ai (hereinafter, also "S/As"), equalizing lines EQLL and EQLR (hereinafter, also "EQLs"), equalizing transistors TEQL and TEQR (hereinafter, also "TEQs"), averaging lines AVGL and AVGR (hereinafter, also "AVGs"), and averaging transistors TAVL and TAVR (hereinafter, also "TAVs").

The memory cells MCs are arranged in a matrix and constitute each of the memory cell arrays MCAL and MCAR (hereinafter, also "MCAs"). The word lines WLs extend in a row direction and are connected to a gate of each of the memory cells MCs. 256 word lines WLs are provided in each of the left and right of the sense amplifiers S/As. In FIG. 2, the word lines WLs are denoted by WLL0 to WLL255 and WLR0 to WLR255. The bit lines BLs extend in a column direction and are connected to a source or a drain of each memory cell MC. 1024 bit lines BLs are provided in each of left and right of the sense amplifiers S/As. In FIG. 2, the bit lines BLs are denoted by BLL0 to BLL1023 and BLR0 to BLR1023. The word lines WLs are orthogonal to the bit lines BLs and the memory cells MCs are provided at points of crossing, respectively. The memory cells MCs are, therefore, also referred to as "cross-point cells". The row direction and the column direction can be replaced with each other.

Before a data read or write operation, data "0," and data "1" having reverse polarities from each other are written to the dummy cells DC0 and DC1, respectively. The writing of the data to the dummy cells DC0 and DC1 is normally started right after power is turned on. The "polarity" indicates a logic value "0" or "1" of the data. The dummy cells DC0 and DC1 are used to generate a reference current Iref when data in the memory cells MC is detected. The reference current Iref is a current almost intermediate between a detection current flowing through a cell storing the data "0" ("0" Cell) and that flowing through a cell storing the data "1" ("1" cell). A current mirror circuit (see FIG. 4) in each sense amplifier S/A applies a current to each memory cell MC via the bit line BL. As a result, a current depending on the polarity of the memory cell MC flows to a sense node in the sense amplifier S/A. The sense amplifier S/A identifies whether the logic value of the data is "1" or "0" by determining whether the current flowing to the sense node is higher or lower than the reference current Iref.

The dummy cells DC0 and DC1 are arranged alternately in the direction in which the word lines WLs extend (i.e., in the row direction). The number of dummy cells DC0 is equal to that of dummy cells DC1.

The dummy word lines DWLs extend in the row direction and are connected to a gate of the dummy cells DCs, respectively. The dummy word lines DWLs are provided in the left and right of the sense amplifiers S/As and denoted by DWLL and DWLR in FIG. 2, respectively.

The equalizing lines EQLs are connected to a gate of the equalizing transistors TEQs, respectively. Each of the equalizing transistors TEQs is provided between the bit line BL and a ground. In an equalizing operation, potentials of the respective bit lines BLs are equalized to a ground potential by connecting the bit lines BLs to the ground.

The averaging lines AVGs are connected to a gate of the averaging transistors TAVs, respectively. Each of the averaging transistors TAVs is connected between two adjacent bit lines BLs, and the averaging transistors TAVs are connected in serially. By shorting the dummy cells DC0 and DC1 by the same number during the data read operation, the current carried across the dummy cells DC0 and DC1 is averaged and the reference current Iref is generated.

Figure 3:
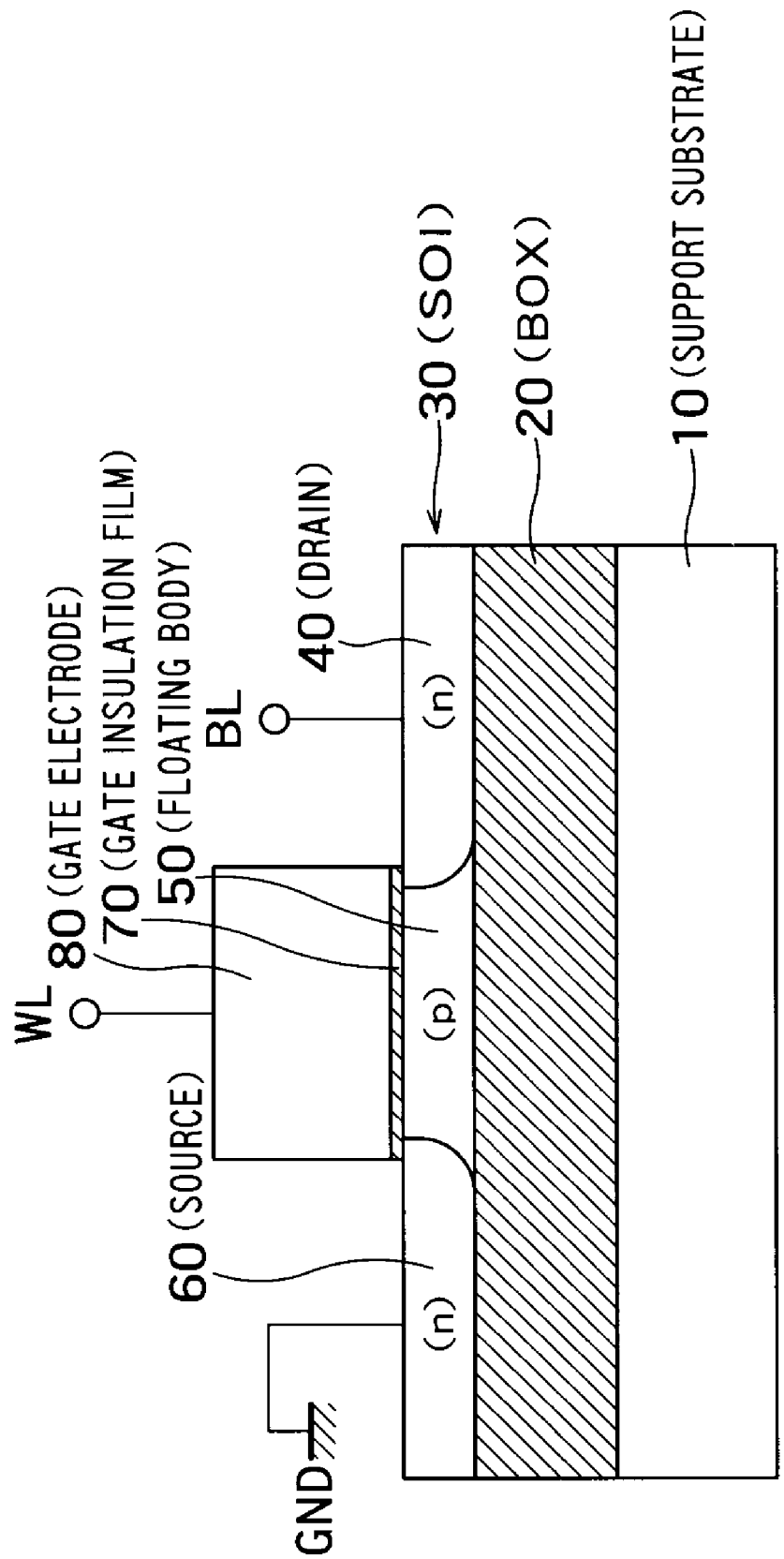
FIG. 3 is a cross-sectional view showing a structure of the memory cell MC or the dummy cell DC.

FIG. 3 is a cross-sectional view showing a structure of each of the memory cells MCs and the dummy cells DCs. The dummy cells DCs are the same in configuration to the memory cells MCs. The memory cell MC is provided on an SOI substrate including a support substrate 10, a BOX layer 20, and an SOI layer 30. A source 60 and a drain 40 are provided in the SOI layer 30. A floating body (hereinafter, also "body") 50 is formed between the source 60 and the drain 40 in the SOI layer 30. The body 50 is a semiconductor opposite in conduction-type to the source 60 and the drain 40. In the first embodiment, the memory cell MC is an N-FET. A part of or all of the body 50 is surrounded by the source 60, the drain 40, the BOX layer 20, a gate insulating layer 70, and an STI (Shallow Trench Isolation) (not shown), whereby the body 50 is in an electrically floating state. The FBC memory device can store data in the memory cells MC according to the number of majority carriers in the body 50 of each memory cell MC.

It is assumed, for example, that the memory cells MCs are N-MISFETs. It is defined that a state in which the number of holes accumulated in the body 50 is large corresponds to the data "1" and that a state in which the number of holes accumulated in the body 50 is small corresponds to the data "0".

To write the data "1" to a memory cell MC, the memory cell MC is caused to operate in a saturation state. For example, the word line WL is biased to 1.5 volts (V) and the bit line BL is biased to 1.5 V. A source potential is set to a ground potential GND (0 V). By so setting, impact ionization occurs near the drain 40 and a large quantity of electron-hole pairs are generated. The electrons generated by the impact ionization flow to the drain 40 whereas the holes are accumulated in the body 50 having a low potential. When a current carried during generation of the holes by the impact ionization is equal to a forward current at a pn junction between the body 50 and the source 60, a body voltage turns into an equilibrium state. The body voltage in the equilibrium state is about 0.7 V.

To write the data "0" to a memory cell MC, the voltage of the bit line BL is lowered to a negative voltage, e.g., −1.5 V. By this operation, a pn junction between the body 50 and the drain 40 is strongly biased in a forward direction. The holes accumulated in the body 50 are discharged to the drain 40, thereby storing the data "0" in the memory cell MC.

In the data read operation, the word line WL is activated similarly to the data write operation but the voltage of the bit line BL is set lower than that when the data "1" is written to the memory cell MC. For example, the voltage of the word line WL is set to 1.5 V and that of the bit line BL is set to 0.2 V. The memory cell MC is caused to operate in a linear region. The memory cell MC storing therein the data "0" differs from the memory cell MC storing therein the data "1" in threshold voltage due to the difference in the number of holes accumulated in the body 50. By detecting the difference in threshold voltage, it is distinguished whether the data is "1" or "0". The reason for setting the bit line BL to the low voltage in the data read operation is as follows. If the voltage of the bit line BL is set high to bias the memory cell MC to the saturation state, there is a probability that the data "0" is changed to the data "1" due to the impact ionization when the data "0" is read.

Figure 4:
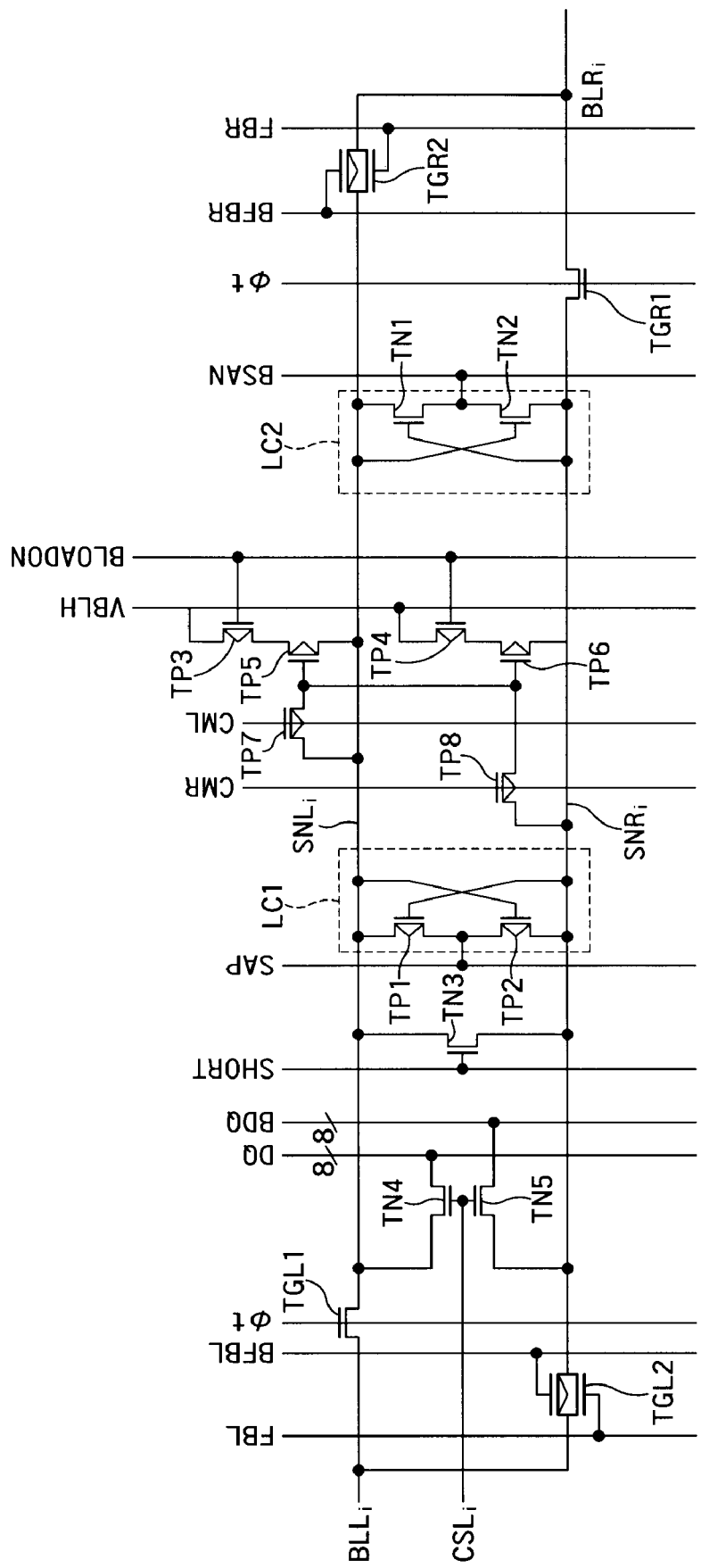
FIG. 4 is a circuit diagram showing a configuration of the sense amplifier S/A.

FIG. 4 is a circuit diagram showing a configuration of each of the sense amplifiers S/Ai (hereinafter, also "S/As"). The sense amplifier S/A is connected to one bit line BLLi and one bit line BLRi (hereinafter, also "BLs") provided in the left and right of the sense amplifier S/A, respectively, and provided to correspond to a pair of the bit lines BLLi and BLRi. As can be seen, in the first embodiment, an open bit line configuration is adopted. Due to this, in the data read operation, one of the paired bit lines BLLi and BLRi transmits data whereas the other bit line transmits the reference potential Vref.

The sense amplifier S/A includes a pair of sense nodes SNLi (hereinafter, also "SNL") and SNRi (hereinafter, also "SNR"). The sense node SNL is connected to the bit line BLLi via a transfer gate TGL1, and connected to the bit line BLRi via a transfer gate TGR2. The sense node SNR is connected to the bit line BLLi via a transfer gate TGL2, and connected to the bit line BLRi via a transfer gate TGR1.

The transfer gates TGL1 and TGR1 are controlled to be turned on or off by a signal Φt. The transfer gate TGL2 is controlled to be turned on and off by signals FBL and BFBL, respectively. The transfer gate TGR2 is controlled to be turned on and off by signals FBR and BFBR, respectively.

In the data read operation, for example, the sense amplifier S/A reads data from each memory cell MC, outputs the data to the outside via the DQ buffer DQB, and writes back the data to the memory cell MC. If the data "1" on the bit line BLL is read, a threshold voltage of the "1" cell is lower than that of the "0" cell. Due to this, a potential of the sense node SNL is lower than that of the sense node SNR. To write the data "1" back to the memory cell MC, it is necessary to apply a high potential to the bit line BLL. Therefore, the transfer gate TGL2 is turned on, thereby connecting the high-potential sense node SNR to the bit line BLL.

The sense amplifier S/A includes cross-coupled dynamic latch circuits (hereinafter, "latch circuits") LC1 and LC2. The latch circuit LC1 is configured to include two p-type transistors TP1 and TP2 connected in series between the sense nodes SNL and SNR. A gate of the transistor TP1 is connected to the sense node SNR, and a gate of the transistor TP2 is connected to the sense node SNL. Namely, the gates of the transistors TP1 and TP2 are cross-coupled to the sense nodes SNL and SNR, respectively. The latch circuit LC2 is configured to include two n-type transistors TN1 and TN2 connected in series between the sense nodes SNL and SNR. A gate of the transistor TN1 is connected to the sense node SNR, and a gate of the transistor TN2 is connected to the sense node SNL. Namely, the gates of the transistors TN1 and TN2 are cross-coupled to the sense nodes SNL and SNR, respectively. The latch circuits LC1 and LC2 are driven by activating signals SAP and BSAN, respectively.

The sense amplifier S/A also includes p-type transistors TP3 to TP8. The transistors TP3 to TP8 constitute a current-mirror-type current load circuit and are configured to apply an equal current to the sense nodes SNL and SNR. The transistors TP3 and TP4 are controlled by a load signal BLOADON and function as switching elements switching between a power supply VBLH and the current mirror. The symbol VBLH denotes a high potential applied to the bit line BL when the data "1" is written to the memory cell MC. The transistors TP7 and TP8 are controlled by signals CML and CMR, and connect gates of the transistors TP5 and TP6 to the sense nodes SNL and SNR, respectively.

An n-type transistor TN3 is connected between the sense nodes SNL and SNR and controlled by a signal SHORT. The transistor TN3 shorts the sense node SNL to the sense node SNR before the data read or write operation, thereby equalizing the sense node SNL to the sense node SNR.

An n-type transistor TN4 is connected between a DQ line and the sense node SNL, and an n-type transistor TN5 is connected between a BDQ line and the sense node SNR. Gates of the respective transistors TN4 and TN5 are connected to a column selection line CSLi (hereinafter, also "CSL"). The DQ line and BDQ line are connected to the DQ buffer DQB. As already described with reference to FIG. 1, the DQ buffer DQB is connected to an I/O circuit, temporarily stores therein data from the memory cell MC to output the data to the outside in the data read operation, and temporarily stores therein data from the outside to transmit the data to the sense amplifier S/A in the data write operation. Accordingly, the column selection line CSL is activated when the data is read to the outside or written from the outside, thereby enabling the sense nodes SNL and SNR to be connected to the DQ buffer DQB. In a data refresh operation, the column selection line CSL is kept inactive.

Figure 5:
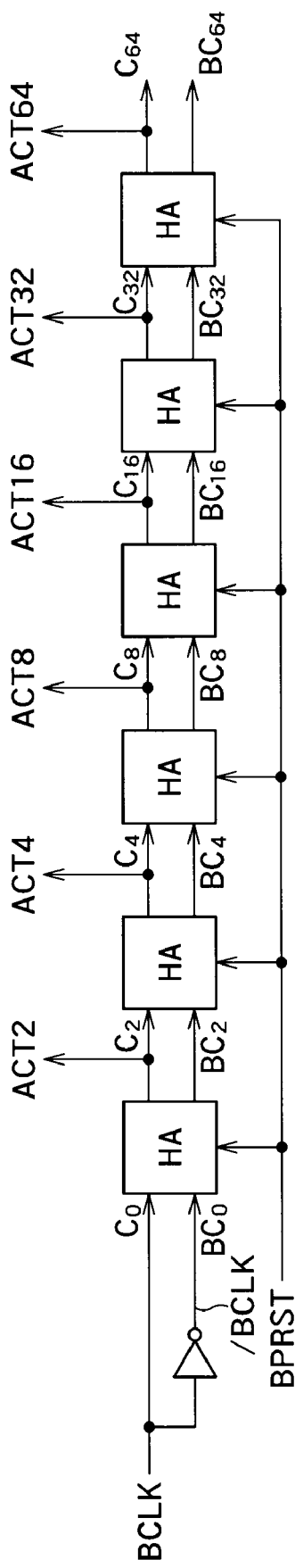
FIGS. 5 and 6 are circuit diagrams showing an internal configuration of the burst length counter BLC.
Figure 6:
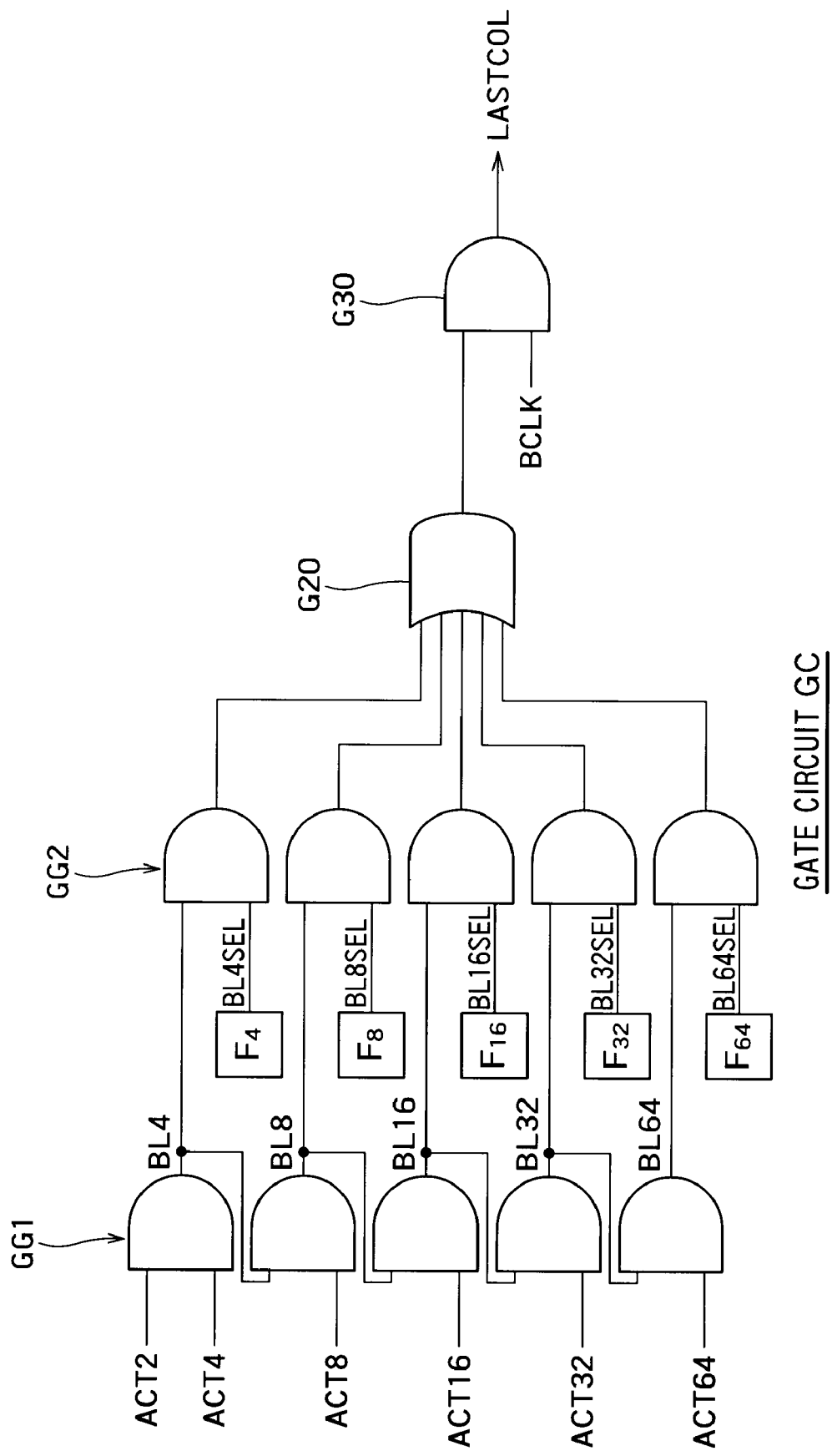

FIGS. 5 and 6 are circuit diagrams showing an internal configuration of the burst length counter BLC. An adder circuit AC shown in FIG. 5 counts the number of times of rising of the burst clock signal BCLK. The adder circuit AC is constituted by connecting a plurality of half-adders HAs shown in FIG. 8 to one another. The adder circuit AC outputs carries Ck (where k=2, 4, 6, 16, 32 and 64) from the respective half-adders HAs as signals ACTk. A power-on reset signal BPRST is at low level (LOW) at the beginning of turning on power, and initializes all the half-adders HAs and the carries Ck to LOW. A few moment after the power is turned on, the power-on reset signal BPRST becomes high level (HIGH) to activate latching functions in the half-adders HAs.

A gate circuit GC shown in FIG. 6 is configured to output the last column signal LASTCOL using the signal ACTk from the adder circuit AC. The gate circuit GC functions to set a burst length.

A gate group GG1 including a plurality of AND gates is configured so that the signals ACTk are input to the gate group GG1 and signals BLj (where j=4, 8, 16, 32, and 64) are output from the gate group GG1. The relationship between the signals ACTk and BLj is as follows. If the signals ACT2 and ACT4 are 1 (HIGH), the signal BL4 is 1 (HIGH). If the signals ACT2 to ACT8 are 1 (HIGH), the signals BL4 and BL8 are 1 (HIGH). If the signals ACT2 to ACT16 are 1 (HIGH), the signals BL4 to BL16 are 1 (HIGH). If the signals ACT2 to ACT32 are 1 (HIGH), the signals BL4 to BL32 are 1 (HIGH). If the signals ACT2 to ACT64 are 1 (HIGH), the signals BL4 to BL64 are 1 (HIGH).

Figure 7:
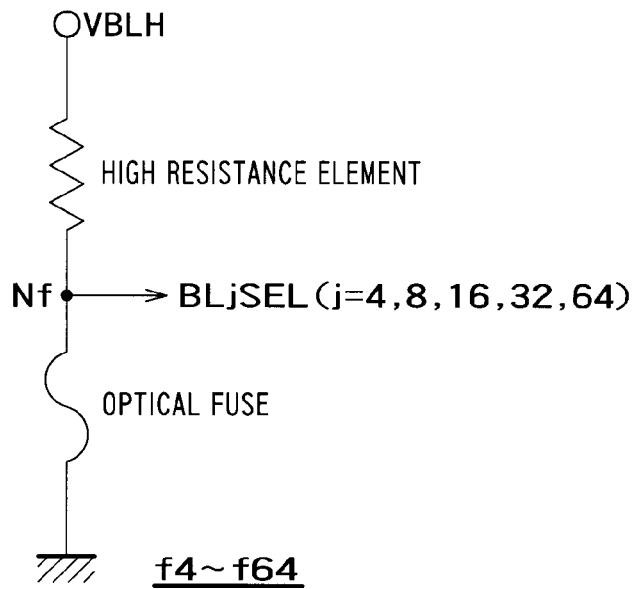
FIG. 7 shows a configuration of each fuse fj.

A gate group GG2 including a plurality of AND gates is configured so that signals BLj and BLjSEL are input to the gate group GG2 and logical ANDs between the signals BLj and BLjSEL are output from the gate group GG2. The signals BLjSEL are generated by fuses, respectively. A configuration of each fuse fj is shown in FIG. 7. A node Nf is connected to a power supply VBLH via a high resistance element, and grounded via an optical fuse. A resistance of the optical fuse is far lower than that of the high resistance element. Due to this, before blowing the fuse fj, the signal BLjSEL becomes LOW. On the contrary, after blowing the fuse fj, the signal BLjSEL becomes HIGH. By allowing the signal BLjSEL to become HIGH, the signal BLj corresponding to the signal BLjSEL becomes effective. For example, if the fuse F16 is blown, the signal BL16SE becomes HIGH while the other signals BLjSEL remain LOW. Accordingly, the signal BL16 becomes effective whereas the signals BL4, BL8, BL32, and BL64 become ineffective. This means that the burst length is set to "16 (four bits)". In this case, if the number of column accesses is smaller than 16, the AND gates constituting the gate group GG2 output low level signals. When the number of column accesses reach 16, only the AND gate receiving the signal BL16 outputs a high level signal among all the AND gates constituting the gate group GG2. Accordingly, an OR gate G20 output a high level signal and an AND gate G30 makes the signal BCLK effective. The signal BCLK output from the gate G30 at this time is the last column signal LASTCOL.

The burst length counter BLC shown in FIGS. 5 and 6 can set the burst length from "2 (one bit)" to 64 (six bits)". However, if the number of half-adders HA shown in FIG. 5 is increased and the number of gates in the gate groups GG1 and GG2 and that of fuses fj shown in FIG. 6 are increased, accordingly, it is possible to set the burst length to be equal to or larger than 128 (seven bits).

Figure 8:
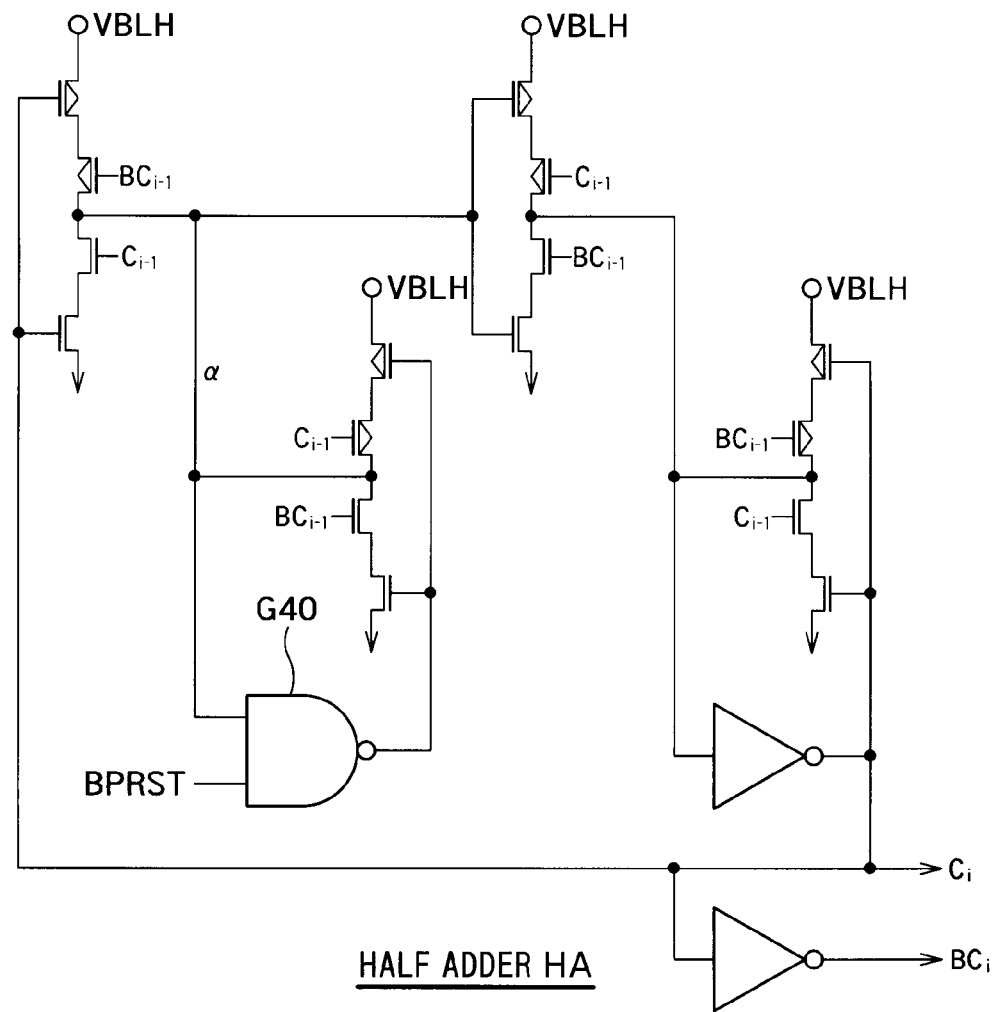
FIG. 8 is a schematic diagram showing an internal configuration of the half-adder HA.

FIG. 8 is a schematic diagram showing an internal configuration of the half-adder HA. A NAND gate G40 functions as an inverter after the power is turned on and the power-on reset signal BPRST becomes HIGH. The half-adder HA does not operate when the carry Ci-1 from the former half-adder HA is HIGH. The half-adder HA raises or lowers the carry Ci when the carry Ci-1 becomes LOW. A carry bar BCi is an inverted signal of the carry Ci.

Figure 9:
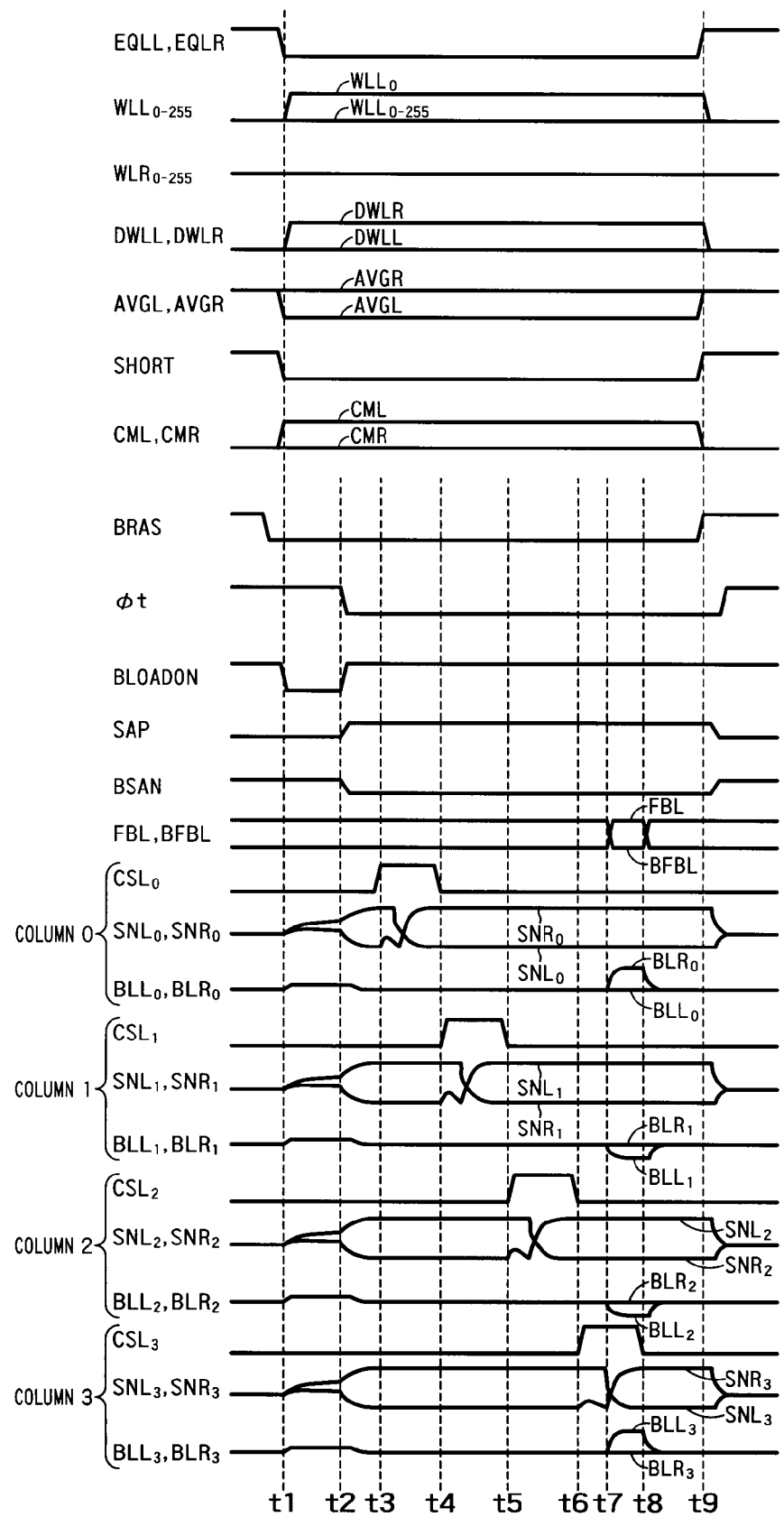
FIG. 9 is a timing chart showing the data write operation performed by the FBC memory device according to the first embodiment.

FIG. 9 is a timing chart showing the data write operation performed by the FBC memory device according to the first embodiment. In the first embodiment, data is continuously written to the sense amplifiers S/A0 to S/A3 corresponding to four columns 0 to 3 in a burst mode. Therefore, the burst length is set to "4 (two bits)" and only the fuse F4 shown in FIG. 6 is blown. The setting of the burst length is made at the time of manufacturing the FBC memory device. A fuse-based burst length program shown in FIG. 7 can be replaced by a nonvolatile memory element or volatile memory element-based burst length program. If the nonvolatile memory element or volatile memory element-based burst length program is adopted, the burst length can be set either when the FBC memory device is incorporated into a product or before such a product is used.

In the data write operation, data in memory cells MCs is read to each of the sense amplifiers S/A, the data is updated to write data from the DQ buffer DQB, and the write data is written from the sense amplifiers S/As to the memory cells MC. In the first embodiment, it is assumed that the word line WLL0 is activated, and that the sense amplifiers S/As write the write data to the memory cells MC via the bit lines BLLs.

First, precharging is finished when a row address signal BRAS is active (LOW), and the word lines WLL and the dummy word lines DWLR are selectable. At t1, the signals EQLL and EQLR are set LOW, thereby closing the equalizing transistors TEQL and TEQR shown in FIG. 2. By doing so, the bit lines BLLi and BLRi shorted to the ground (VSL) are all turned into high impedance state. At the same time, the signal SHORT is set LOW, thereby disconnecting the paired sense nodes SNLi and SNRi from each other. Further, at t1, the signal AVGL is lowered to LOW, thereby turning off the averaging transistors TAVLs shown in FIG. 2. As a result, the bit lines BLLi in the memory cell array MCAL are disconnected from one another. On the other hand, since the signal AVGR is kept HIGH, the averaging transistors TAVRs are kept to be turned on. As a result, the bit lines BLRi in the memory cell array MCAR are kept connected to one another.

By setting the signal CML to high level, the transistor TP7 in each sense amplifier S/A is turned off. By keeping the signal CMR low level, the sense node SNRi is kept connected to the gate of the transistor TP6 in each sense amplifier S/A.

At t1, the signals FBL and FBR are LOW. Due to this, the transfer gates TGL2 and TGR2 are turned off. The bit line BLLi is disconnected from the sense node SNRi, and the bit line BLRi is disconnected from the sense node SNLi in each sense amplifier S/A. However, since the signal Φt is HIGH, the bit line BLLi is kept connected to the sense node SNLi and the bit line BLRi is kept connected to the sense node SNRi in each sense amplifier S/A.

Since the signal BLOADON is LOW, the current mirror tries to apply the reference current Iref to the memory cells MCs and the dummy cells DCs from the power supply VBLH via the sense nodes SNLi and SNRi and the bit lines BLLi and BLRi. Actually, since the threshold voltages between "0" cell and "1" cell are different from each other, the currents flowing in the "0" cell and "1" cell are different from each other. Therefore, a potential difference (signal difference) appears between each pair of sense nodes SNLi and SNRi.

When the potential of the signal difference exceeds a certain value (at t2), the signal Φt is set LOW. As a result, the bit lines BLLi and BLRi are disconnected from the sense nodes SNLi and SNRi, respectively.

At t2, the signals SAP and BSAN are activated. The latch circuits LC1 and LC2 thereby amplify the signals transmitted to the sense nodes SNLi and SNRi and latch the amplified signals to the sense nodes SNLi and SNRi in each sense amplifier S/A. In this way, the data read operation is executed simultaneously for the columns 0 to 3.

At t3, right after the latching is finished, the column selection line CSL0 is activated in the column 0. As a result, from t3 to t4, the write data is transmitted to the sense amplifier S/A0 to thereby update the data latched in the sense amplifier S/A0. In the column 0, for example, each selected memory cell MC stores therein the data "0" and the write data is "1". Accordingly, from t3 to t4, the signal level of the sense node SNL0 and that of the sense node SNR0 reverse. After the sense amplifier S/A0 latches the write data, the column selection line CSL0 is deactivated at t4.

From t4 to t5, the column 1 is selected. Similarly to the column 0 from t3 to t4, the sense amplifier S/A1 latches the write data. From t5 to t6, the column 2 is selected and the sense amplifier S/A2 latches the write data. From t6 to t8, the column 3 is selected and the sense amplifier S/A3 latches the write data.

It is to be noted that the signals FBL and BFBL are kept inactive until the column 3 is selected. In the period in which the signals FBL and BFBL are kept inactive, the sense amplifiers S/A0 to S/A3 are not connected to the bit lines BLL0 to BLL3, respectively and keep latching the write data.

From t7 to t8, the signals FBL and BFBL are activated. As a result, the sense amplifiers S/A0 to S/A3 are connected to the corresponding bit lines BLL0 to BLL3, respectively and write the write data to each memory cell MC.

The last column signal LASTCOL from the burst length counter BLC shown in FIG. 1 is activated, whereby the sense amplifier controller SAC activates the signals FBL and BFBL.

In the conventional FBC memory device, the signals FBL and BFBL are activated since the selection of the column 0 (t3) until the selection of the column 3 (t8) in the burst mode. In this case, in the period from t3 to t8, the sense amplifiers S/As continue to apply current to the bit lines BLs in all the columns.

In the first embodiment, by contrast, the signals FBL and BFBL are activated only in the period from t7 to t8 right after the column 3 is selected. Namely, after each of the sense amplifiers S/A0 to S/A3 holds the write data, the transfer gates TGL2 connect the sense amplifiers S/A0 to S/A3 to the bit lines BLL0 to BLL3, respectively. Accordingly, it suffices to apply the bias current used to write the data from the sense amplifiers S/As to the corresponding bit lines BLs only in the period from t7 to t8 for all the columns. As a result, according to the first embodiment, it is possible to reduce current consumption in the data write operation in the burst mode.

Figure 10:
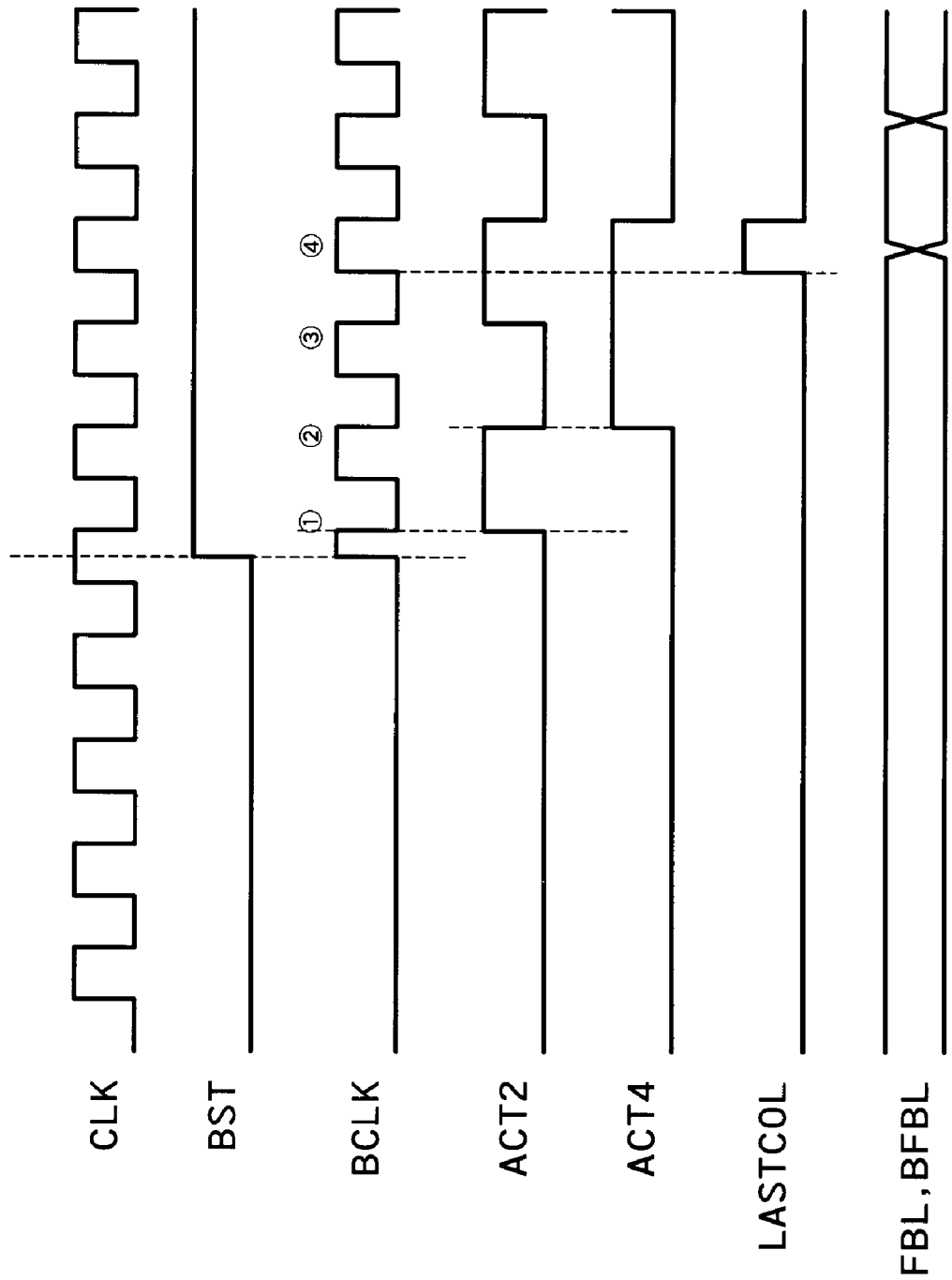
FIG. 10 is a timing chart showing operation performed by the burst length counter BLC in a burst mode.

FIG. 10 is a timing chart showing operation performed by the burst length counter BLC in a burst mode. With reference to FIG. 10, a method of counting serial accesses to the columns 0 to 3 will be described. The clock signal CLK decides timing of an access operation performed by the FBC memory device. In the burst mode, the burst start signal BST is activated. When the burst start signal BST is activated, the AND gate G10 shown in FIG. 1 transmits the clock signal CLK to the burst length counter BLC as the clock BCLK. The burst length counter BLC counts the number of pulses of the clock signal BCLK. In the first embodiment, the burst length is set to "4 (two bits)". Therefore, when counting a fourth pulse of the clock signal BCLK, the burst length counter BLC activates the last column signal LASTCOL.

When the last column signal LASTCOL is activated, the sense amplifier controller SAC controls each sense amplifier S/A to activate the signals FBL and BFBL. As a result, the transfer gate TGL2 shown in FIG. 4 connects the bit lines BLs in each of all the columns to the corresponding sense nodes SNLi and SNRi. At this time, the data latched to the sense nodes SNLi and SNRi is written to the memory cells MCs connected to the corresponding bit lines BLs.

The period since the last column signal LASTCOL is activated until the signals FBL and BFBL are activated can be changed by providing a delay circuit between the burst length counter BLC and the sense amplifier controller SAC. If the period is changeable, it is possible to turn on the transfer gate TGL2 simultaneously with the writing of data to the memory cells MCs in the column 3. As a result, it is possible to simultaneously write data to the memory cells MCs in the columns 0 to 3 without unnecessarily consuming power.

As can be understood, in the first embodiment, the transfer gate TGL2 in each sense amplifier S/A connects the sense nodes SNLi and SNRi to the bit lines BLs for quite a short period of time in the burst mode. Due to this, the FBC memory device according to the first embodiment can reduce the current consumption at the time of the data write operation in the burst mode. Furthermore, in the first embodiment, there is no need to provide a circuit for connecting a selected bit line BL to the corresponding sense amplifier S/A. It is, therefore, possible to suppress an increase in the circuit scale of the sense amplifier S/A.

In the first embodiment, the burst length can be programmed by using the fuses fj and the gate group GG2 shown in FIG. 6. If the burst length is known for a certain product, the burst length may be fixed by eliminating the fuses fj and the gates of the gate group GG2. In this case, the burst length is decided according to the number of gates constituting the gate group GG1.

The fuse-based burst length program method can be replaced by the nonvolatile or volatile memory element-based program. If the nonvolatile memory element or volatile memory element-based burst length program is adopted, a desired burst length can be set stored in a nonvolatile or volatile memory element either when the FBC memory device is incorporated into a product or before such a product is used right after powered-on the memory.

Second Embodiment

In the first embodiment, the transfer gate TGL2 is activated when the number of serial accesses reaches a predetermined value. In a second embodiment of the present invention, the transfer gate TGL2 is activated at a moment when writing of the data to each sense amplifier S/A is finished, irrespectively of the number of serial accesses in the burst mode. The moment when the writing of the data is finished is a moment when the signal BRAS is deactivated. It suffices that the sense amplifier controller SAC activates the signals FBL and BFBL when the signal BRAS is deactivated. Therefore, an FBC memory device according to the second embodiment can dispense with the burst length counter BLC and the gate G10 shown in FIG. 1.

Figure 11:
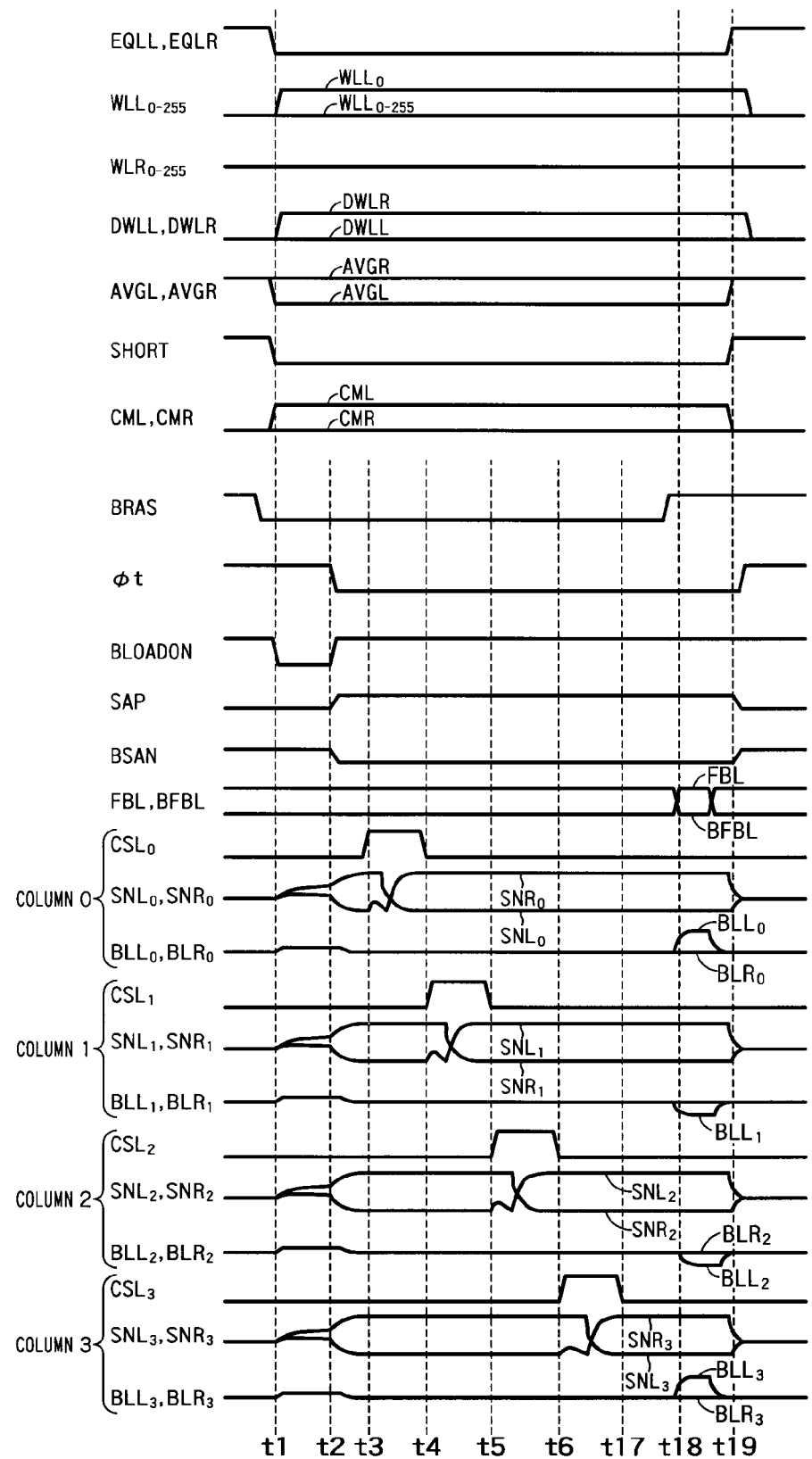
FIG. 11 is a timing chart showing a data write operation performed by the FBC memory device according to the second embodiment.

FIG. 11 is a timing chart showing a data write operation performed by the FBC memory device according to the second embodiment. In the second embodiment, the signals FBL and BFBL are activated when the signal BRAS is deactivated. A burst length can be, therefore, arbitrarily set. Further, the burst length can be changed for every cycle of a data read or write operation. "To deactivate the signal BRAS" means that the data read or write operation is finished and that the FBC memory device turns into a precharging state.

The operation from t1 to t6 in the second embodiment can be the same as that from t1 to t6 in the first embodiment. Next, after the sense amplifier S/A3 corresponding to the last column 3 latches the write data at t17, the signal BRAS is deactivated.

At t18, since the row address signal BRAS is deactivated, the signals FBL and BFBL are activated. As a result, the transfer gate TGL2 in each of the sense amplifiers S/As for all the columns can simultaneously connect sense nodes SNRi and SNLi for all the columns to the bit lines BLs for all the columns, respectively. Therefore, the second embodiment can exhibit the same advantages as those of the first embodiment. Moreover, in the second embodiment, since the burst length counter BLC and the gate G10 can be dispensed with, it is possible to downsize the entire FBC memory device.

The period from the deactivation of the signal BRAS to the activation of the signals FBL and BFBL can be changed by providing a delay circuit in the memory controller MC.

Third Embodiment

Figure 12:
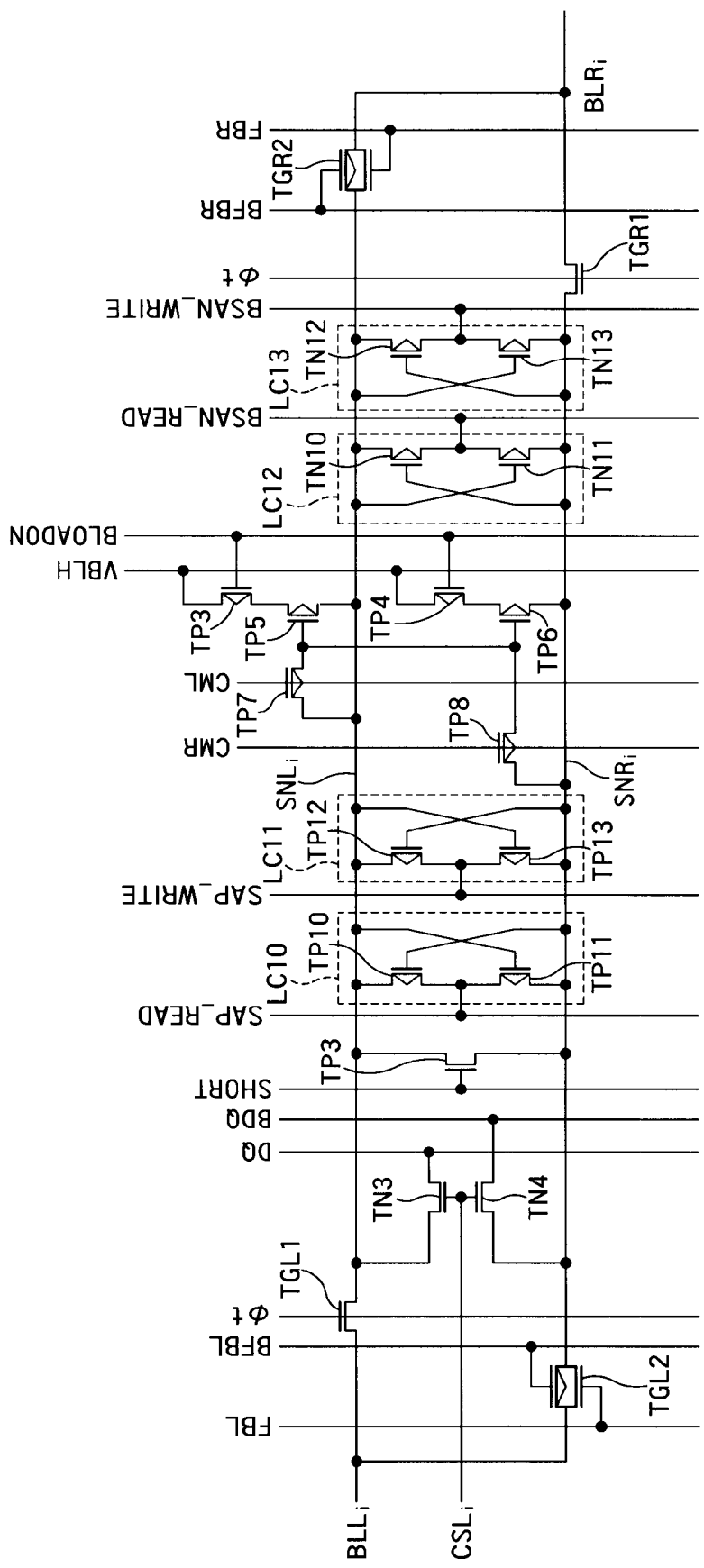
FIG. 12 is a circuit diagram showing a configuration of each of sense amplifiers S/Ai in an FBC memory device according to a third embodiment.

FIG. 12 is a circuit diagram showing a configuration of each of sense amplifiers S/Ai in an FBC memory device according to a third embodiment of the present invention. The sense amplifier S/Ai according to the third embodiment is configured as follows, as compared with the sense amplifier S/Ai according to the first embodiment. A first latch circuit LC10 and a second latch circuit LC11 including PMOS transistors TP10 to TP13 are arranged in place of the first latch circuit LC1. A third latch circuit LC12 and a fourth latch circuit LC13 including NMOS transistors TN10 to TN13 are arranged in place of the second latch circuit LC2. Other constituent elements of the sense amplifier S/A according to the third embodiment can be the same as those of the sense amplifier S/A according to the first embodiment.

The transistors TP10 and TP11 are connected in series between the sense node SNL and SNR. The transistors TP12 and TP13 are connected in series between the sense node SNL and SNR. Gates of the transistors TP10 and TP12 are connected in common to the sense node SNR. Gates of the transistors TP11 and TP13 are connected in common to the sense node SNL. Namely, the gates of the transistors TP10 and TP12 and those of the transistors TP11 and TP13 are cross-coupled to the sense nodes SNL and SNR, respectively.

The transistors TN10 and TN11 are connected in series between the sense node SNL and SNR. The transistors TN12 and TN13 are connected in series between the sense node SNL and SNR. Gates of the transistors TN10 and TN12 are connected in common to the sense node SNR. Gates of the transistors TN11 and TN13 are connected in common to the sense node SNL. Namely, the gates of the transistors TN10 and TN12 and those of the transistors TN11 and TN13 are cross-coupled to the sense nodes SNL and SNR, respectively.

A signal SAP_READ is input to a node between the transistors TP10 and TP11. A signal SAP_WRITE is input to a node between the transistors TP12 and TP13. A signal BSAN_READ is input to a node between the transistors TN10 and TN11. A signal BSAN_WRITE is input to a node between the transistors TN12 and TN13.

Generally, a voltage of data latched to a sense node is dropped by transistors included in a latch circuit and the voltage-dropped data is transmitted to each memory cell MC. To avoid voltage drop of the latched data, it is necessary to make each of the transistors in the latch circuit larger in size (W/L). If the size (W/L) of each transistor in the latch circuit is larger, a current driving capability of the transistor is higher. However, if the size (W/L) of each of the transistors in the latch circuit is larger, it takes a longer time to latch the data read from each memory cell MC and to latch the data written from the DQ buffer DQB. This makes a cycle time of the data read or write operation longer. Furthermore, if the time to latch the read data is longer, a through-current to each memory cell MC is higher. As for the size (W/L), symbols W and L denote a channel width and a channel length, respectively.

According to the third embodiment, to overcome the above-stated disadvantages, when each sense amplifier S/A latches data, only the latch circuit LC10 (or LC12) is used. The sense amplifier S/A latches the data from each memory cell MC in the data read operation, and latches the data from the DQ buffer DQB in the data write operation. It is thereby possible to shorten the cycle time when the data is latched and to suppress the through-current low. Besides, each sense amplifier S/A can latch data at high speed in the data write operation. The transistors TN4 and TN5 can be made smaller in size (W/L). Since a speed of writing the data to the sense amplifier S/A is accelerated, the FBC memory device can deal with a high speed burst mode.

On the other hand, if each sense amplifier S/A writes the data to each memory cell MC, both the latch circuits LC10 and LC11 (or both the latch circuits LC12 and LC13) are employed. By doing so, if data is to written to each memory cell MC, the sense amplifier S/A can write the data to each memory cell MC with a sufficiently high current driving capability and the cycle time can be shortened.

The transistors TP10 and TP11 are equal in size and the transistors TP12 and TP13 are equal in size. The transistors TP10 and TP11 can be either equal to or different from the transistors TP12 and TP13 in size. To improve the above-stated advantage, it is preferable that sizes (W/L) of the transistors TP12 and TP13 are larger than those of the transistors TP10 and TP11. Further, the transistors TN10 and TN11 are equal in size and the transistors TN12 and TN13 are equal in size. The transistors TN10 and TN11 can be either equal to or different from the transistors TN12 and TN13 in size. To improve the above-stated advantage, it is preferable that sizes (W/L) of the transistors TN12 and TN13 are larger than those of the transistors TN10 and TN11.

Figure 13:
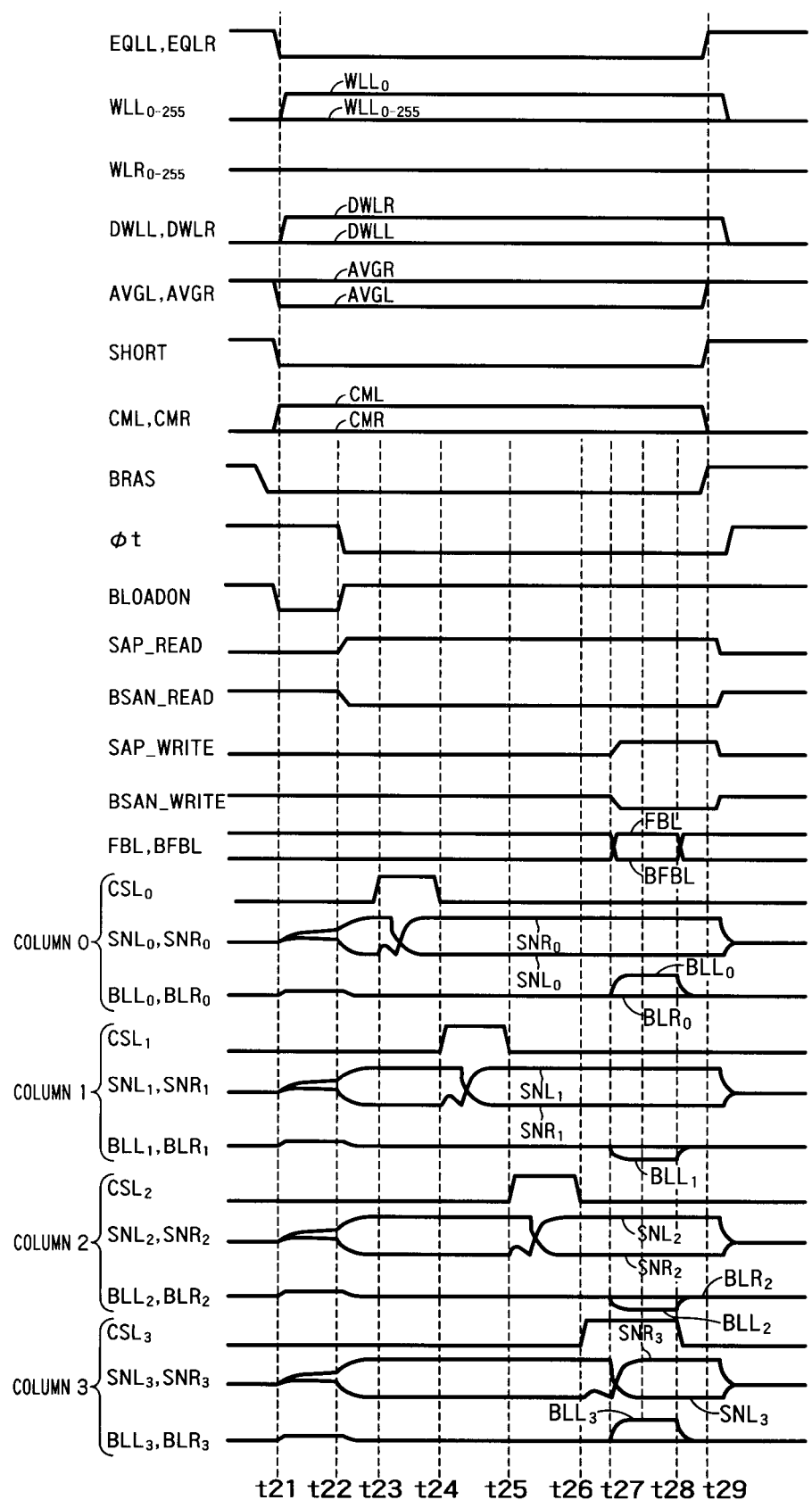
FIG. 13 is a timing chart showing the data write operation performed by the FBC memory device according to the third embodiment.

FIG. 13 is a timing chart showing the data write operation performed by the FBC memory device according to the third embodiment. In the third embodiment, the burst length is set in advance.

To read data to each sense amplifier S/A, the signals SAP_READ and BSAN_READ are activated (t22). By doing so, the data is latched only by the latch circuits LC10 and LC12. From t23 to t24, when the data from the DQ buffer DQB is written to each sense amplifier S/A, the data is latched only by the latch circuits LC10 and LC12. By doing so, each sense amplifier S/A can write the data at high speed with low current consumption.

At t27, when data is written from each sense amplifier S/A to each memory cell MC, not only the signals SAP_READ and BSAN_READ but also the signals SAP_WRITE and BSAN_WRITE are activated. By doing so, data is written to each memory cell MC not only via the latch circuits LC10 and LC12 but also via the latch circuits LC11 and LC13. Each sense amplifier S/A can thereby write the data to each memory cell MC with sufficiently a high current driving capability.

Since other operations in the third embodiment are the same as those in the first embodiment, explanations thereof will be omitted.

The signals SAP_WRITE and BSAN_WRITE can be activated based on activation of the last column signal LASTCOL similarly to the signals FBL and BFBL.

Fourth Embodiment

A fourth embodiment of the present invention is a combination of the second and third embodiments. In the fourth embodiment, similarly to the second embodiment, the transfer gate TGL2 is activated at the moment when writing of the data to each sense amplifier S/A is finished (i.e., when the signal BRAS is deactivated), irrespectively of the number of serial accesses in the burst mode. Therefore, an FBC memory device according to the fourth embodiment can dispense with the burst length counter BLC and the gate G10. Other constituent elements of the FBC memory device according to the fourth embodiment can be the same as those according to the third embodiment. The signals SAP_WRITE and BSAN_WRITE are activated when the signal BRAS is deactivated similarly to the signals FBL and BFBL.

Figure 14:
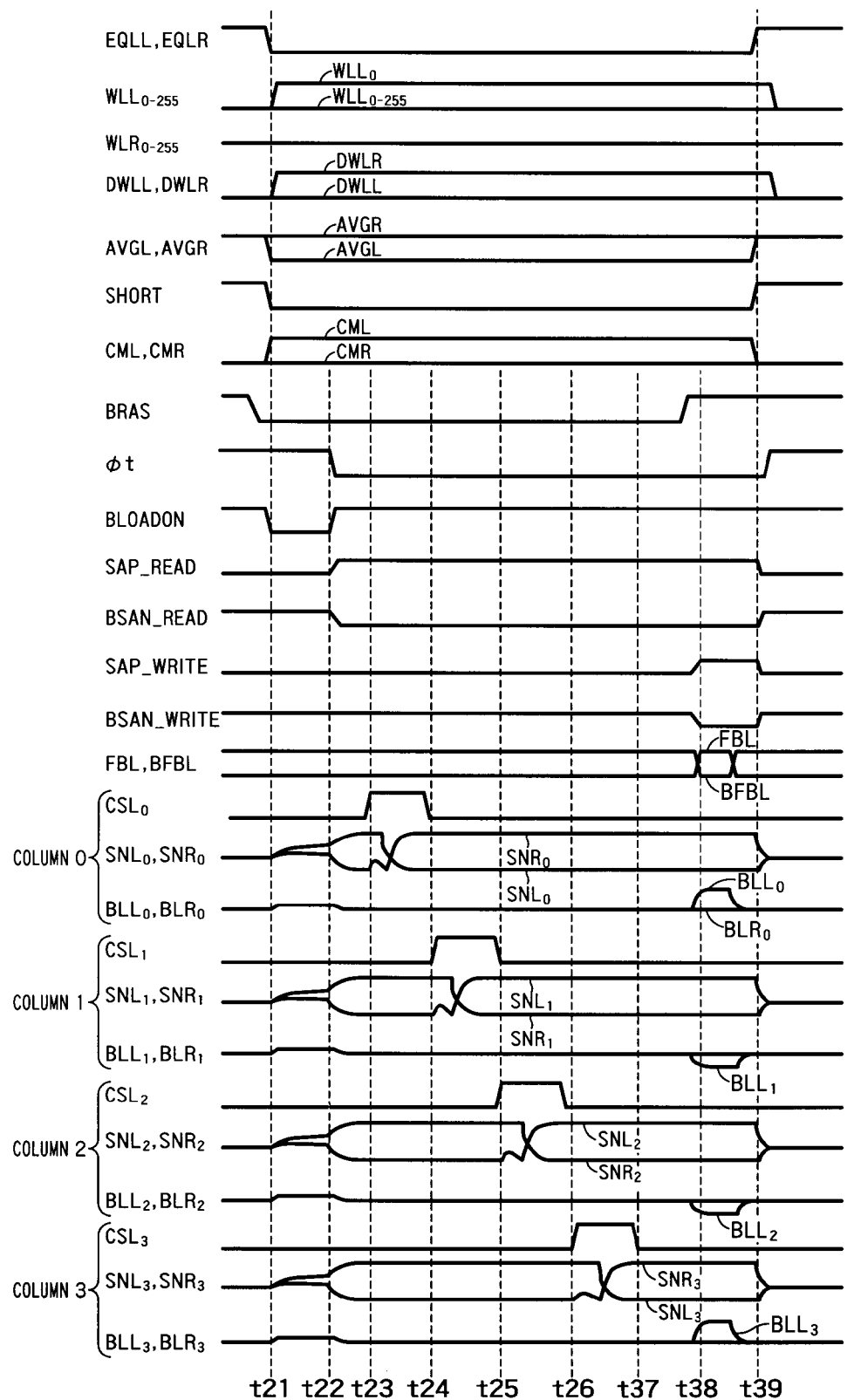
FIG. 14 is a timing chart showing a data write operation performed by the FBC memory device according to the fourth embodiment.

FIG. 14 is a timing chart showing a data write operation performed by the FBC memory device according to the fourth embodiment. In the fourth embodiment, the signals FBL and BFBL are activated when the signal BRAS is deactivated. Therefore, a burst length can be arbitrarily set. Further, the burst length can be changed for every cycle of a data read or write operation.

The operation from t21 to t26 in the fourth embodiment can be the same as that from t21 to t26 in the third embodiment. Next, after the sense amplifier S/A3 corresponding to the last column 3 latches the write data at t37, the row address signal BRAS is deactivated.

At t38, since the row address signal BRAS is deactivated, the signals FBL and BFBL and the signals SAP_WRITE and BSAN_WRITE are activated. It is thereby possible to change a size of each of transistors in each latch circuit. Therefore, the fourth embodiment can exhibit the same advantages as those of the third embodiment.

Fifth Embodiment

In the first to fourth embodiments, the reference current Iref is generated using the dummy cells DCs and the current mirror circuits. An FBC memory device according to a fifth embodiment of the present invention does not include dummy cells DCs and current mirror circuits. The reference potential Vref for generating Iref is supplied from an outside of each memory cell array MCA.

Figure 15:
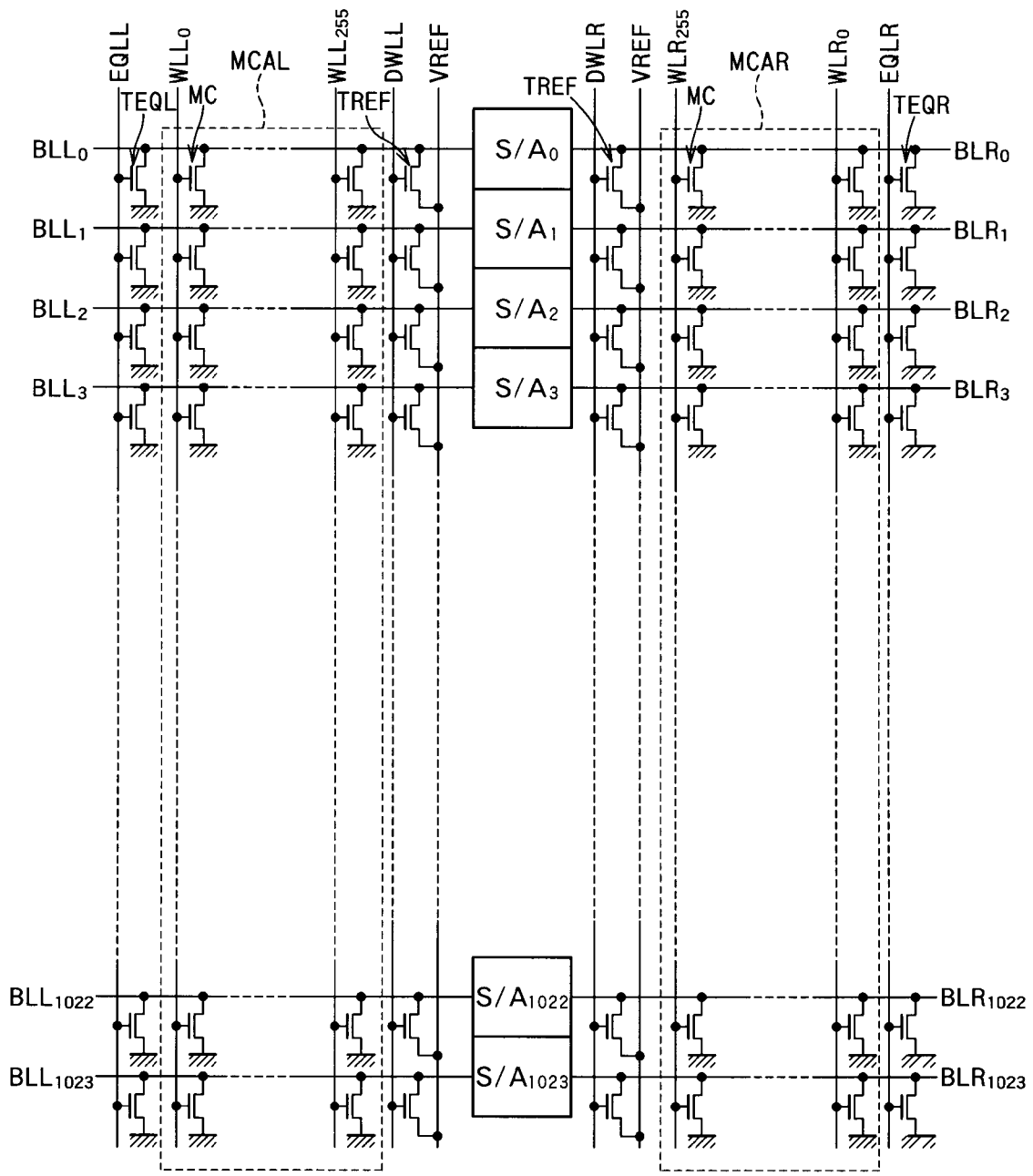
FIG. 15 is a circuit diagram showing internal configurations of the memory cell arrays MCAL and MCAR according to the fifth embodiment.

FIG. 15 is a circuit diagram showing an internal configuration of each of the memory cell arrays MCAL and MCAR according to the fifth embodiment. In the fifth embodiment, each MCA does not include averaging transistors TAVLs and TAVRs, signal lines AVGL and AVGR, and dummy cells DC1 and DC0, but newly includes reference transistors TREFs and signal lines VFEFs. Other constituent elements of the MCA according to the fifth embodiment can be the same as those according to the first embodiment shown in FIG. 2.

Each of the signal lines VREFs propagates the reference potential Vref generated outside of the memory cell array MCA. Each of the reference transistors TREFs is connected between each signal line VREF and each bit line BL and can applies the reference current Iref to the bit line BL.

Figure 16:
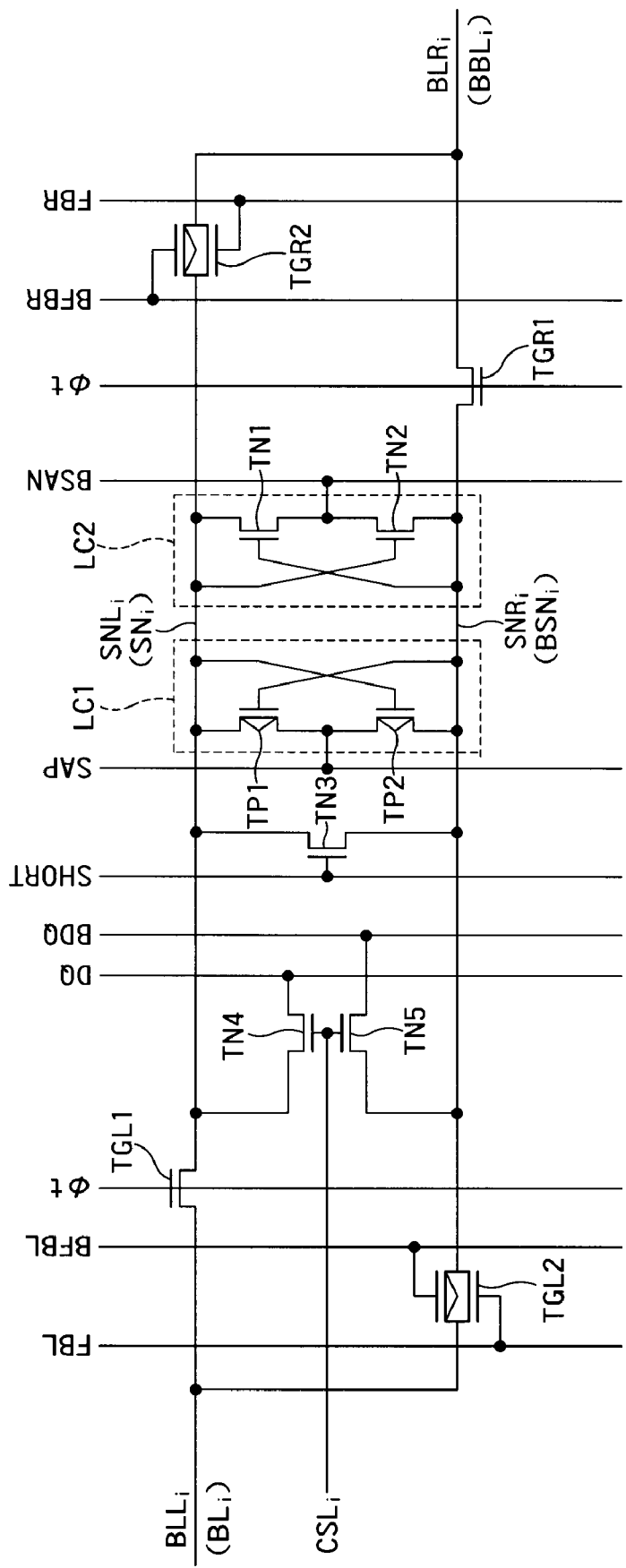
FIG. 16 is a circuit diagram showing a configuration of the sense amplifier S/A.

FIG. 16 is a circuit diagram showing a configuration of each of the sense amplifiers S/A. In the fifth embodiment, each sense amplifier S/A does not include a current mirror circuit. Other constituent elements of the sense amplifier S/A according to the fifth embodiment can be the same as those according to the first embodiment shown in FIG. 4.

The FBC memory device according to the fifth embodiment operates almost similarly to the FBC memory device according to the first embodiment. However, because of lack of the current mirror circuit in each sense amplifier S/A according to the fifth embodiment, differently from the first embodiment, the signal BLOADON is not present. Furthermore, the signals AVGL and AVGR for actuating the averaging transistors TAVs are not present.

The fifth embodiment can be easily applied to each of the second to fourth embodiments. In this case, the averaging transistors TAVL and TAVR, the signal lines AVGL and AVGR, and the dummy cells DC1 and DC0 can be omitted and the reference transistors TREFs and the signal lines VFEFs can be added.

By combining the fifth embodiment with one of the second to fourth embodiments, the fifth embodiment can exhibit the advantages of one of the second to fourth embodiments. Furthermore, because of lack of the current mirror circuits and the dummy cells DCs, the FBC memory device according to the fifth embodiment can be made small in size.

Sixth Embodiment

Figure 17:
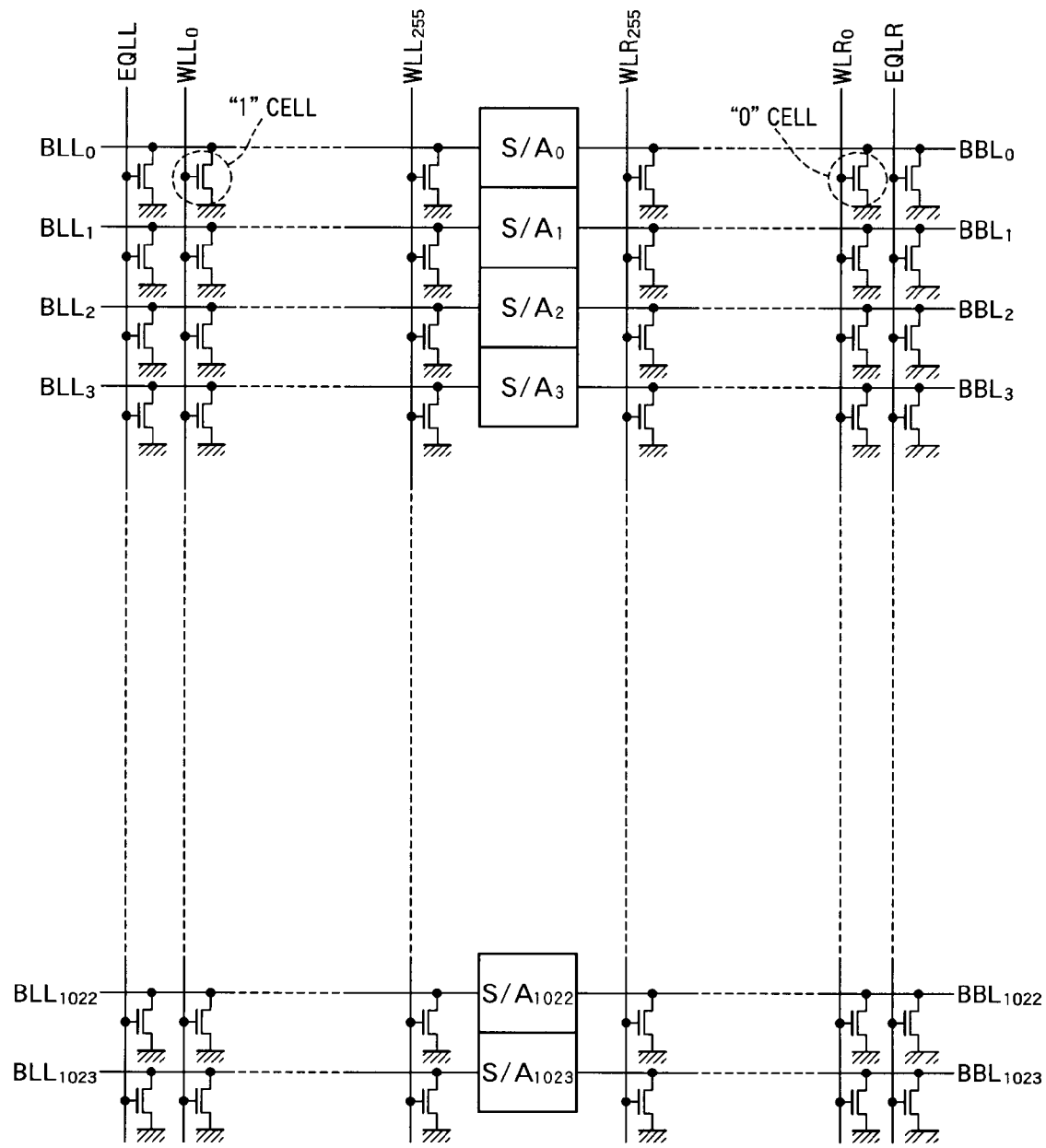
FIG. 17 is a circuit diagram showing internal configurations of the memory cell arrays MCAL and MCAR according to the sixth embodiment.

A sixth embodiment of the present invention is an embodiment in which a so-called "twin cell" configuration is applied to the first embodiment. The twin cell configuration is also referred to as "two cells/bit" configuration. The twin cell is a configuration for storing data having reverse polarities from each other in a pair of memory cells MCs, respectively, thereby storing one-bit data. Each of the sense amplifiers S/As uses one of the data having reverse polarities from each other as reference data and detects the other data. With the twin cell configuration, therefore, there is no need to provide dummy cells DCs, reference potential lines VREFs, and reference transistors TREFs. In the sixth embodiment, the "1" cell and the "0" cell are arranged on both sides of each sense amplifier S/A, respectively, as shown in FIG. 17.

Since each of the sense amplifiers S/As according to the sixth embodiment is the same in configuration to that shown in FIG. 16, it will not be explained herein. However, as indicated by brackets in FIG. 16, in the twin cell method, the bit lines and the sense nodes are denoted by different reference symbols.

Figure 18:
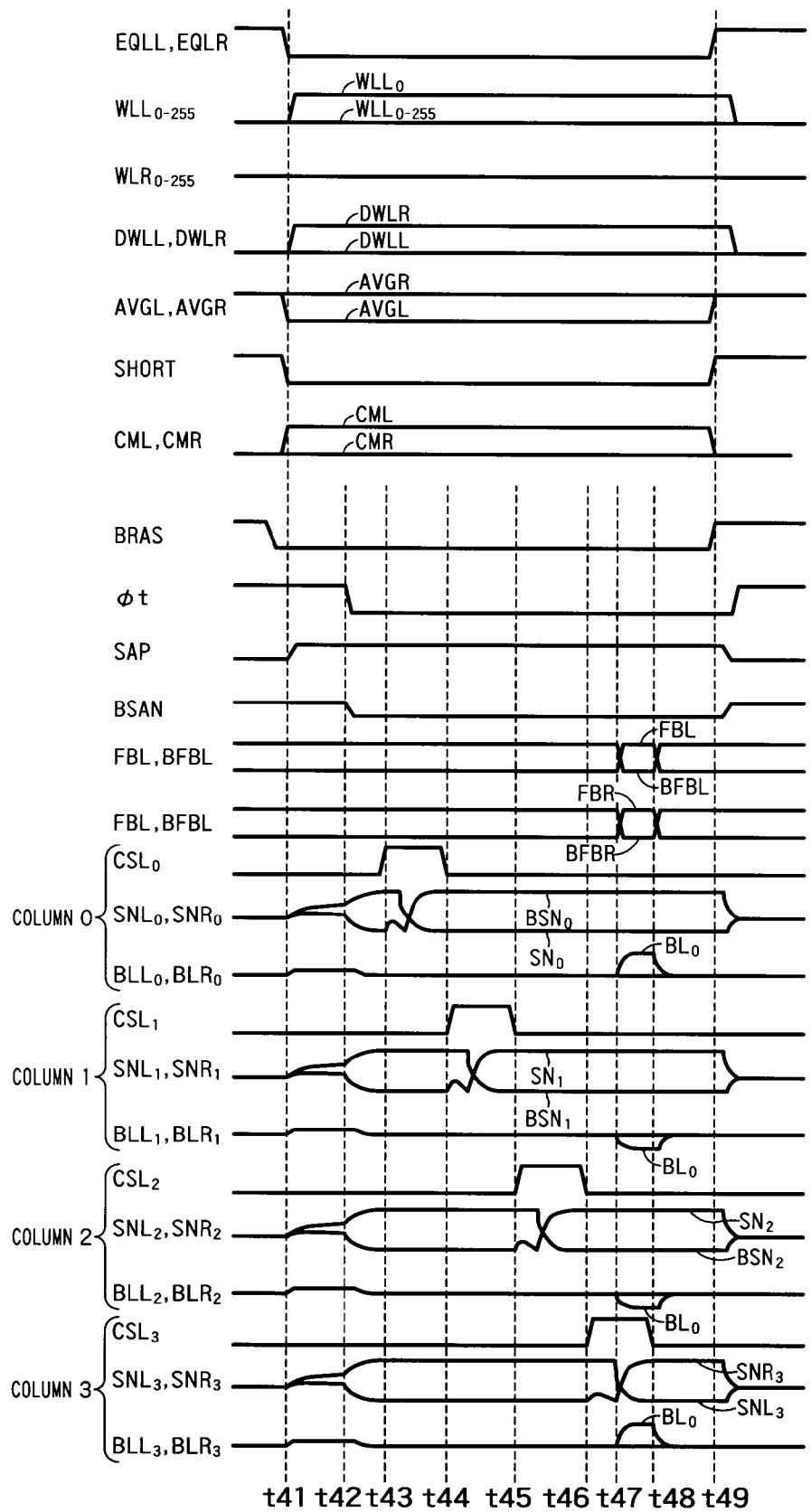
FIG. 18 is a timing chart showing operation performed by an FBC memory device according to the sixth embodiment.

FIG. 18 is a timing chart showing operation performed by an FBC memory device according to the sixth embodiment. In the sixth embodiment, to read data having reverse polarities from each other in a data read or write operation, word lines WL0 and WLR0 are both raised right after t41. Moreover, it is necessary to transmit data having reverse polarities from each other to bit lines BLi and BBLi, respectively in the data write operation. Accordingly, signals FBL and BFBL and signals FBR and BFBR are all activated from t47 to t48.

The sixth embodiment can exhibit the same advantage as those of the first embodiment. The twin cell method shown in the sixth embodiment can be applied to each of the second to fourth embodiments. Therefore, by combining the sixth embodiment with one of the second to fourth embodiments, the sixth embodiment can exhibit the advantages of one of the second to fourth embodiments.

Seventh Embodiment

Figure 19:
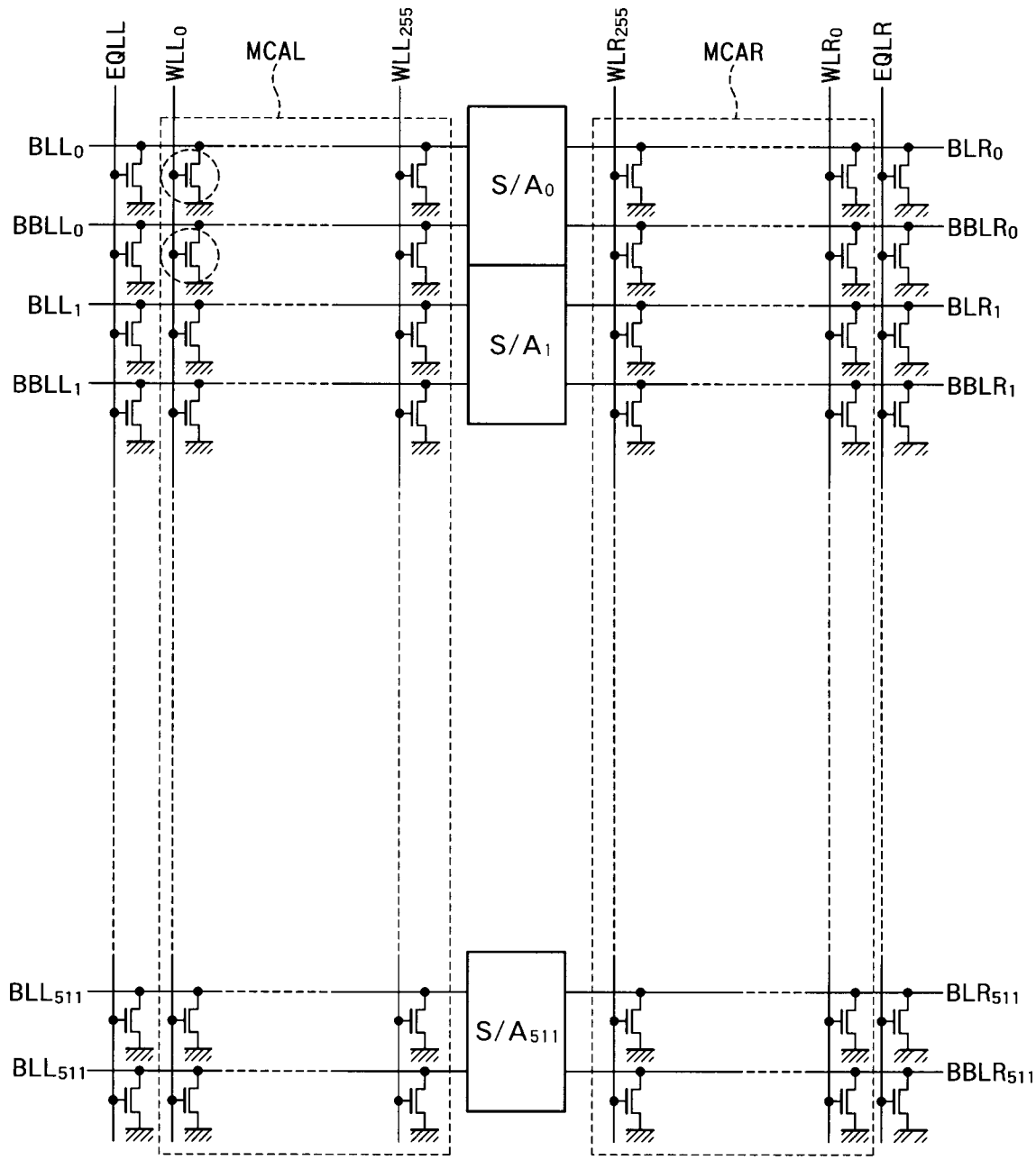
FIG. 19 is a circuit diagram showing a configuration of an FBC memory device according to a seventh embodiment.

FIG. 19 is a circuit diagram showing a configuration of an FBC memory device according to a seventh embodiment of the present invention. The seventh embodiment is another embodiment of the twin cell method, i.e., an embodiment of the FBC memory device of a folded bit-line type. In the FBC memory device of the folded bit-line type, each pair of memory cells MCs are arranged to be adjacent to each other as indicated by broken line circles.

Figure 20:
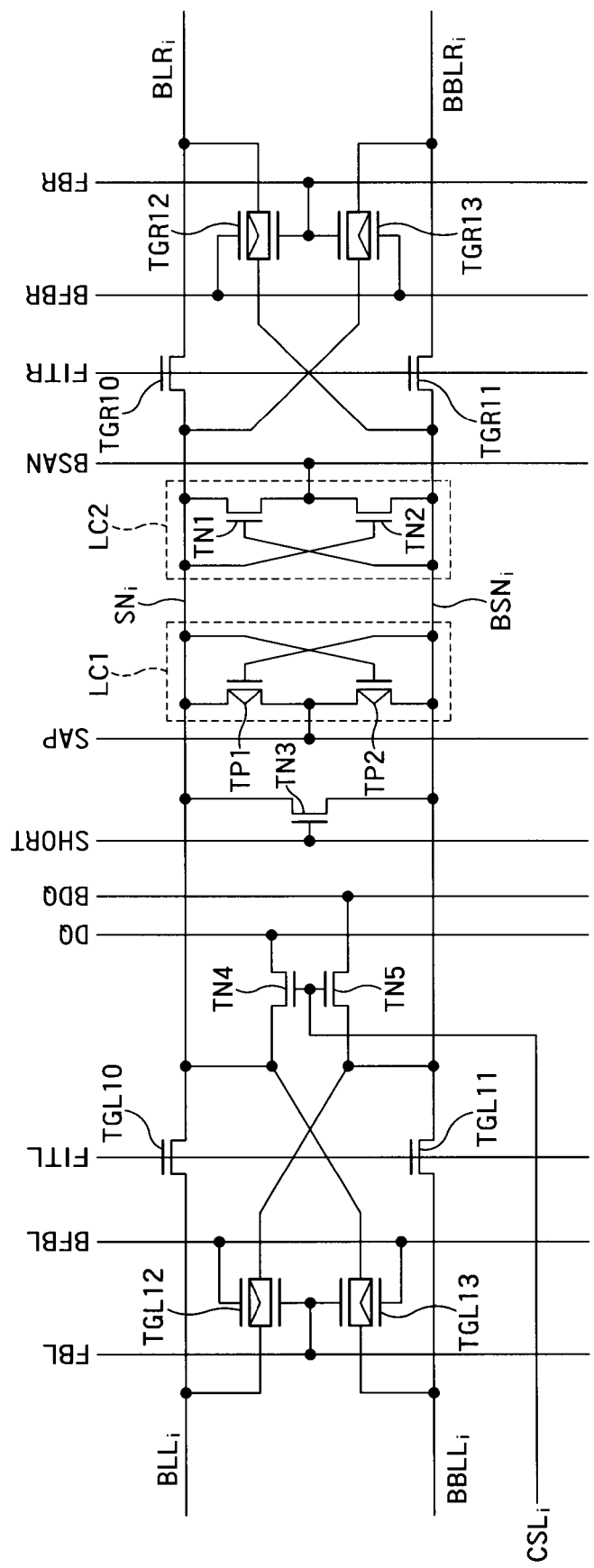
FIG. 20 is a circuit diagram showing a configuration of each of sense amplifiers S/Ai (also "S/As") according to the seventh embodiment.

FIG. 20 is a circuit diagram showing a configuration of each of sense amplifiers S/Ai (also "S/As") according to the seventh embodiment. In case of the folded bit-line type, each sense amplifier S/A includes two additional transfer gates in each of the left and right. Transfer gates TGL10 and TGR10 are connected between a sense node SN and bit lines BLLi and BLRi, respectively. Transfer gates TGL11 and TGR11 are connected between a sense node BSN and bit lines BBLLi and BBLRi, respectively. Transfer gates TGL12 and TGR12 are connected between the sense node BSN and the bit lines BLLi and BLRi, respectively. Transfer gates TGL13 and TGR13 are connected between the sense node SN and the bit lines BBLLi and BBLRi, respectively. One of the bit lines BLLi and BBLLi serves as a reference bit line for the other bit line and one of the bit lines BBRi and BBLRi serves as a reference bit line for the other bit line.

In the seventh embodiment, each pair of memory cells MCs can be arranged to be adjacent to each other. If the distance between the paired memory cells MCs is short, the memory cells MCs have uniform electronic characteristics. It is, therefore, possible to read data more accurately. The seventh embodiment can be applied to each of the first to fourth embodiments. Therefore, by combining the seventh embodiment with one of the first to fourth embodiments, the seventh embodiment can exhibit the advantages of one of the second to fourth embodiments.

Eighth Embodiment

Figure 21:
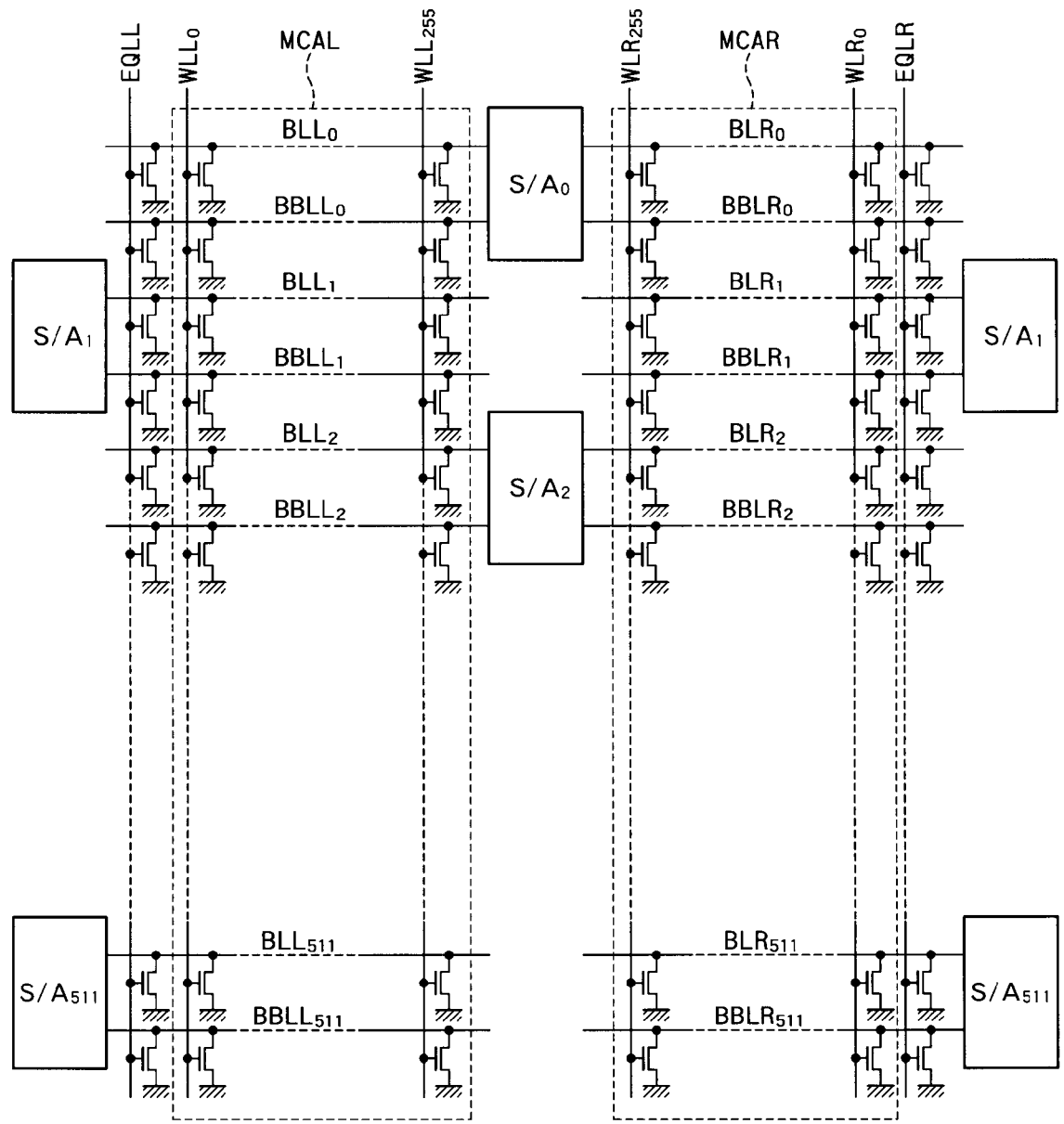
FIG. 21 is a circuit diagram showing a configuration of an FBC memory device according to an eighth embodiment.

FIG. 21 is a circuit diagram showing a configuration of an FBC memory device according to an eighth embodiment of the present invention. The FBC memory device according to the eighth embodiment is also a folded bit-line type memory device. However, differently from the seventh embodiment, sense amplifiers S/Ai are alternately arranged in the left and right of the memory cell arrays for every paired bit lines (every column). The sense amplifiers S/Ai of this structure are so-called double-ended sense amplifiers.

In the eighth embodiment, since the interval between the adjacent sense amplifiers S/As is wide, a layout of each sense amplifier S/A can be easily designed.

All the embodiments which are explained are applicable not only to the data write operation but also to an operation for writing back data from each sense amplifier S/A to each memory cell MC in the data read operation. It is to be noted that "writing" of data includes not only "writing" of data in the data write operation but also "writing back" of data in the data read operation.

In those embodiments, measures against the charge pumping phenomenon are apparently taken at the time of selecting the last column in a burst mode. By doing so, there is no need to replenish the memory cells with holes to deal with the charge pumping phenomenon right after reading of data as conventionally performed.

The charge pumping phenomenon is the phenomenon that the number of holes accumulated in memory cells gradually decreases in the data read or write operation. If the charge pumping phenomenon repeatedly occurs, a state of the data "1" stored in the memory cells is changed to a state of the data "0". To deal with the phenomenon, it is necessary to perform an operation for replenishing the unselected "1" cell with holes.

In those embodiments, the operation for replenishing the "1" cell with holes is performed simultaneously for all the columns selected in the burst mode at the time of selecting the last column in the burst mode. In those embodiments, therefore, current consumption can be reduced as compared with the FBC memory device configured to take measures against the charge pumping phenomenon even in the data read operation.

Those embodiments are applicable not only to the FBC memory device but also to any memory device in which data is written to each memory cell by applying a current in the data write operation. Those embodiments are applicable to, for example, an MRAM or a PRAM.

To realize high-speed column access, it is necessary for each sense amplifier to latch the data of the memory cells on the word lines in the MRAM or the like. This operation is referred to as "sense amplifier caching". The sense amplifier caching can accelerate an access to data in a certain page (a change in column address). In a period in which the page is opened by the sense amplifier caching, when the memory cells are connected to the sense amplifier, a DC current is continuously applied to the memory cells. Accordingly, after data in a certain row (page) is transferred to the sense amplifier, it is preferable to disconnect the memory cells from the sense amplifier so as to reduce current consumption.

In the data read operation, even after the data has been read from the page, the memory cells can remain disconnected from the sense amplifier. In the data write operation, however, memory cells in the column selected in each cycle are connected to each sense amplifier, and it is necessary to write data to the memory cells in each time of the connections between the memory cells and the sense amplifiers (first measures), or it is necessary to simply rewrite each sense amplifier during the serial access in the burst mode and to connect the memory cells in all the columns to the sense amplifiers after the end of the serial access (second measures) as stated in those embodiments. To realize saving of power consumption and high-speed operation, it is preferable to take the second measures.

The invention claimed is:

1. A semiconductor memory device comprising:
a plurality of memory cells, data being written to the memory cells by current carried in the memory cells;
a plurality of word lines connected to nodes of the memory cells;
a plurality of bit lines connected to the other nodes of the plurality of memory cells;
a plurality of sense amplifiers detecting data stored in the memory cells via the bit lines, the sense amplifiers writing data to the memory cells via the bit lines and latching read data or data to be written; and
a plurality of transfer gates connecting or disconnecting the sense amplifiers to or from the bit lines, wherein
in a period of a serial access for continuously writing the data to the memory cells connected to an activated word line among the word lines, the transfer gates disconnect the sense amplifiers and the bit lines until all of the sense amplifiers to be selected in the serial access latch the data, and the transfer gates connect the selected sense amplifiers to the bit lines after all of the selected sense amplifiers latch the data.

2. The semiconductor memory device according to claim 1, further comprising a counter counting number of times of writing or reading the data to or from the selected sense amplifiers in the period of the serial access, and activating a first signal when the number of times of writing reaches a predetermined value, wherein
the transfer gates are turned on based on activation of the first signal.

3. The semiconductor memory device according to claim 2, wherein the counter counts the number of times of writing or reading the data to or from the selected sense amplifiers by counting pulses of a clock signal from start of the period of the serial access, the clock signal controlling a write operation or a read operation.

4. The semiconductor memory device according to claim 2, wherein
the counter includes
an adder counting the number of times of writing or reading; and
a gate circuit setting the predetermined value, the gate circuit receiving the number of times of writing or reading from the adder and activating the first signal when the number of times of writing or reading reaches the predetermined value.

5. The semiconductor memory device according to claim 4, wherein
the gate circuit includes
a plurality of fuse circuits respectively including a node connected to a power supply via a resistor and grounded via a fuse, the fuse circuits deciding the predetermined value by fuses of the fuse circuits being blown or being not blown, and
a gate group outputting the first signal obtained by calculating with respect to the number of times of writing or reading and a signal at each node of the fuse circuits.

6. The semiconductor memory device according to claim 1, wherein the transfer gates are turned on based on a second signal indicating an end of a data write operation or a data read operation.

7. The semiconductor memory device according to claim 1, wherein
each sense amplifier includes
a pair of sense nodes provided to correspond to a pair of bit lines connected to each sense amplifier; and
a latch circuit connected between the pair of sense nodes and latching the data to the pair of sense nodes, the latch circuit including
a first latch unit operating when the data is latched to the sense amplifiers or when the data is written from the sense amplifiers to the memory cells; and
a second latch unit not operating when the data is latched to the sense amplifiers but operating when the data is written from the sense amplifiers to the memory cells.

8. The semiconductor memory device according to claim 2, wherein
each sense amplifier includes
a pair of sense nodes provided to correspond to a pair of bit lines connected to each sense amplifier; and
a latch circuit connected between the pair of sense nodes and latching the data to the pair of sense nodes, the latch circuit including
a first latch unit operating when the data is latched to the sense amplifiers or when the data is written from the sense amplifiers to the memory cells; and
a second latch unit not operating when the data is latched to the sense amplifiers but operating when the data is written from the sense amplifiers to the memory cells.

9. The semiconductor memory device according to claim 3, wherein
each sense amplifier includes
a pair of sense nodes provided to correspond to a pair of bit lines connected to each sense amplifier; and
a latch circuit connected between the pair of sense nodes and latching the data to the pair of sense nodes, the latch circuit including
a first latch unit operating when the data is latched to the sense amplifiers or when the data is written from the sense amplifiers to the memory cells; and
a second latch unit not operating when the data is latched to the sense amplifiers but operating when the data is written from the sense amplifiers to the memory cells.

10. The semiconductor memory device according to claim 6, wherein
each sense amplifier includes
a pair of sense nodes provided to correspond to a pair of bit lines connected to each sense amplifier; and
a latch circuit connected between the pair of sense nodes and latching the data to the pair of sense nodes, the latch circuit including
a first latch unit operating when the data is latched to the sense amplifiers or when the data is written from the sense amplifiers to the memory cells; and
a second latch unit not operating when the data is latched to the sense amplifiers but operating when the data is written from the sense amplifiers to the memory cells.

11. The semiconductor memory device according to claim 1, wherein a current supplied to the memory cells when the data is written from the sense amplifiers to the memory cells is supplied from an external reference potential.

12. The semiconductor memory device according to claim 1, wherein the sense amplifiers use one of data having reversed polarities from each other as a reference and detecting other data.

13. The semiconductor memory device according to claim 1, wherein the sense amplifiers are alternately arranged in a left and a right of a memory cell array for every pair of bit lines.

* * * * *